United States Patent
Shinozaki

(12)
(10) Patent No.: US 6,333,875 B1
(45) Date of Patent: Dec. 25, 2001

(54) SEMICONDUCTOR CIRCUIT WITH ADJUSTMENT OF DOUBLE DATA RATE DATA LATCH TIMINGS

(75) Inventor: Naoharu Shinozaki, Kawasaki (JP)

(73) Assignee: Fujitsu Limited, Kawaski (JP)

( * ) Notice: Subject to any disclaimer, the term of this patent is extended or adjusted under 35 U.S.C. 154(b) by 0 days.

(21) Appl. No.: 09/666,586

(22) Filed: Sep. 20, 2000

(30) Foreign Application Priority Data

Nov. 1, 1999 (JP) .................................................. 11-310673

(51) Int. Cl.[7] ........................................................ G11C 7/00
(52) U.S. Cl. ............................................ 365/193; 365/194
(58) Field of Search ..................................... 365/193, 194

(56) References Cited

U.S. PATENT DOCUMENTS 4,985,868 * 1/1991 Nakano et al. ..................... 365/222
5,384,735 * 1/1995 Park et al. ......................... 365/189.05
5,896,347 * 4/1999 Tomita et al. ........................ 365/233

* cited by examiner

*Primary Examiner*—David Nelms
*Assistant Examiner*—M. Tran
(74) *Attorney, Agent, or Firm*—Arent Fox Kintner Plotkin & Kahn, PLLC

(57) ABSTRACT

A semiconductor circuit which receives a strobe signal and a data signal includes a latch-signal-generation circuit which generates a first latch signal delayed by a first delay time relative to the strobe signal and a second latch signal inverted and delayed by a second delay time relative to the strobe signal, a control circuit which adaptively controls the latch-signal-generation circuit to adjust timings of the first and second latch signals such that the first delay time and the second delay time become substantially equal, and a latch circuit which latches the data signal at edge timings of the first and second latch signals.

11 Claims, 16 Drawing Sheets

SEMICONDUCTOR CIRCUIT WITH ADJUSTMENT OF DOUBLE DATA RATE DATA LATCH TIMINGS

BACKGROUND OF THE INVENTION

1. Field of the Invention

The present invention generally relates to semiconductor devices, and particularly relates to a semiconductor device such as a DDR-SDRAM (double-data-rate synchronous dynamic random access memory) which latches input signals in synchronization with rising edges and falling edges of a data-strobe signal.

2. Description of the Related Art

FIG. 1 is a circuit diagram showing an example of a data-input circuit provided in a related-art DDR-SDRAM. In FIG. 1, a data-strobe-signal input terminal 1, a data-signal input terminal 2, and a reference-voltage input terminal 3 are shown.

An input circuit 4 for receiving a data strobe signal DQS includes a current-mirror-type differential amplifier 5, NMOS transistors 6 through 8, PMOS transistors 9 and 10, and inverters 11 and 12 for improving waveforms of the output signal of the current-mirror-type differential amplifier 5.

A latch-signal-generation circuit 13 includes inverters 14 through 16 for generating a latch signal SA by delaying and inverting the output signal of the input circuit 4, and further includes inverters 17 and 18 for generating a latch signal SB by delaying the output signal of the input circuit 4.

An input circuit 19 for receiving an input-data signal DQ includes a current-mirror-type differential amplifier 20, NMOS transistors 21 through 23, PMOS transistors 24 and 25, and inverters 26 and 27 for improving waveforms of the output signal of the current-mirror-type differential amplifier 20.

Further, a delay circuit 28 serves as a latch-target-signal generation circuit for generating a latch-target signal SC to be latched by delaying and inverting the output signal of the input circuit 19 so as to generate a delayed version of the input data signal DQ, and includes inverters 29 through 31.

A latch circuit 32 is a synchronous flip-flop circuit, and latches the latch-target signal SC in synchronization with rising edges of the latch signal SA. A latch circuit 33 is a synchronous flip-flop circuit, and latches the latch-target signal SC in synchronization with rising edges of the latch signal SB.

FIG. 2 is a timing chart showing operation of the data-input circuit of FIG. 1. FIG. 2 shows the data-strobe signal DQS input to the input circuit 4, the input-data signal DQ supplied to the input circuit 19, the latch signal SA, the latch signal SB, and the latch-target signal SC.

The related-art DDR-SDRAM shown in FIG. 1 is provided with the two latch circuits 32 and 33. The latch circuit 32 latches the latch-target signal SC in synchronization with the rising edges of the latch signal SA so as to latches the input-data signal DQ at rising edge timings of the data-strobe signal DQS (i.e., at phase positions having a 0 phase in the data-strobe signal DQS). The latch circuit 33 latches the latch-target signal SC in synchronization with the rising edges of the latch signal SB so as to latches the input-data signal DQ at falling edge timings of the data-strobe signal DQS (i.e., at phase positions having a 180 phase in the data-strobe signal DQS).

The latch signal SA is a signal that is obtained by delaying the data-strobe signal DQS by a total delay time ta of all the inverters 14 through 16 and the input circuit 4. The latch signal SB is a signal that is obtained by delaying the data-strobe signal DQS by a total delay time tb of all the inverters 17 and 18 and the input circuit 4. Further, the latch-target signal SC is a delayed version of the input-data signal DQ input to the input circuit 19 where the delay is equal to a total delay time tc of all the input circuit 19 and the delay circuit 28 combined.

In order to improve margins of a setup time tDS and a hold time tDH, which need to be defined with respect to the input-data signal DQ, it is preferable to achieve the conditions of ta=tb. In the related-art DDR-SDRAM shown in FIG. 1, however, there is no way to adjust the delay times ta and tb, except for adjusting a ratio of the charge-supply capacity (pull-up power) to the charge-discharge capacity (pull-down power) of the inverters 14 through 18.

Such adjustment of a ratio of the charge-supply capacity to the charge-discharge capacity of the inverters 14 through 18 can achieve the conditions of ta=tb only under specific circumstances regarding power-supply voltages, temperature, variation due to manufacturing process, etc. Namely, such adjustment cannot achieve the desired condition in a stable manner. In the related-art DDR-SDRAM shown in FIG. 1, therefore, it is almost impossible to improve margins of the setup time tDS and the hold time tDH that ought to be defined with respect to the input-data signal DQ. This hinders an effort toward faster operation speed.

Accordingly, there is a need for a semiconductor circuit that can improve margins of a setup time and a hold time defined with respect to an input signal that is latched at a double data rate, thereby helping efforts toward faster operation speed.

SUMMARY OF THE INVENTION

It is a general object of the present invention to provide a semiconductor circuit that substantially obviates one or more of the problems caused by the limitations and disadvantages of the related art.

It is another and more specific object of the present invention to provide a semiconductor circuit that can improve margins of a setup time and a hold time defined with respect to an input signal that is latched at a double data rate, thereby helping efforts toward faster operation speed.

In order to achieve the above objects according to the present invention, a semiconductor circuit which receives a strobe signal and a data signal includes a latch-signal-generation circuit which generates a first latch signal delayed by a first delay time relative to the strobe signal and a second latch signal inverted and delayed by a second delay time relative to the strobe signal, a control circuit which adaptively controls the latch-signal-generation circuit to adjust timings of the first and second latch signals such that the first delay time and the second delay time become substantially equal, and a latch circuit which latches the data signal at edge timings of the first and second latch signals.

According to the present invention, the semiconductor circuit as described above includes the control circuit which adaptively controls the latch-signal-generation circuit to adjust timings of the first and second latch signals such that the first delay time and the second delay time become substantially equal. Because of such an adaptive control, the first and second delay times are kept equal under varying conditions regarding power-supply voltages, temperature, variation due to manufacturing process, etc. Therefore, the semiconductor circuit of the present invention can improve margins of a setup time and a hold time defined with respect to the data signal latched at a double data rate, thereby helping efforts toward faster operation speed.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
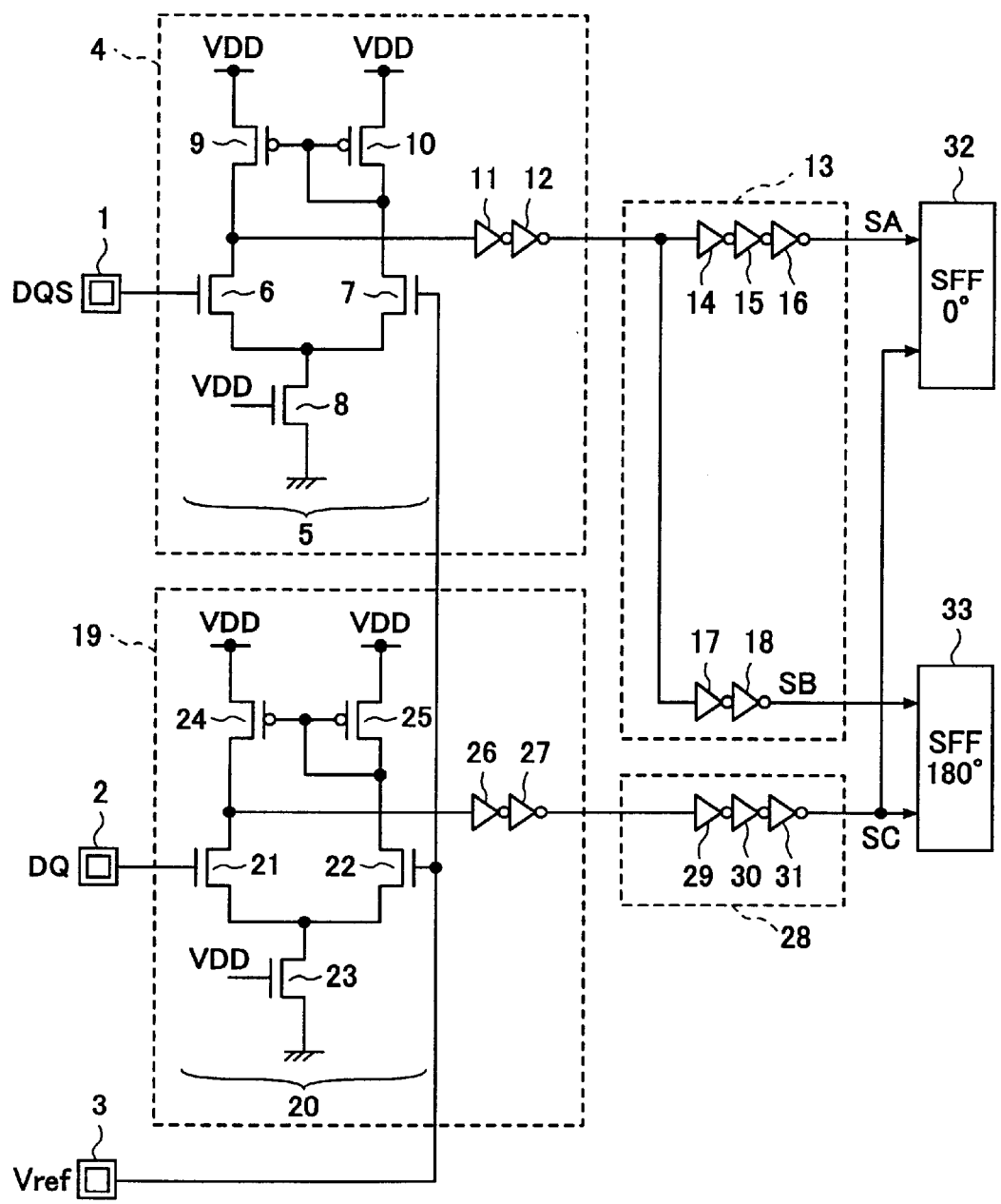
FIG. 1 is a circuit diagram showing an example of a data-input circuit provided in a related-art DDR-SDRAM.
Figure 2:
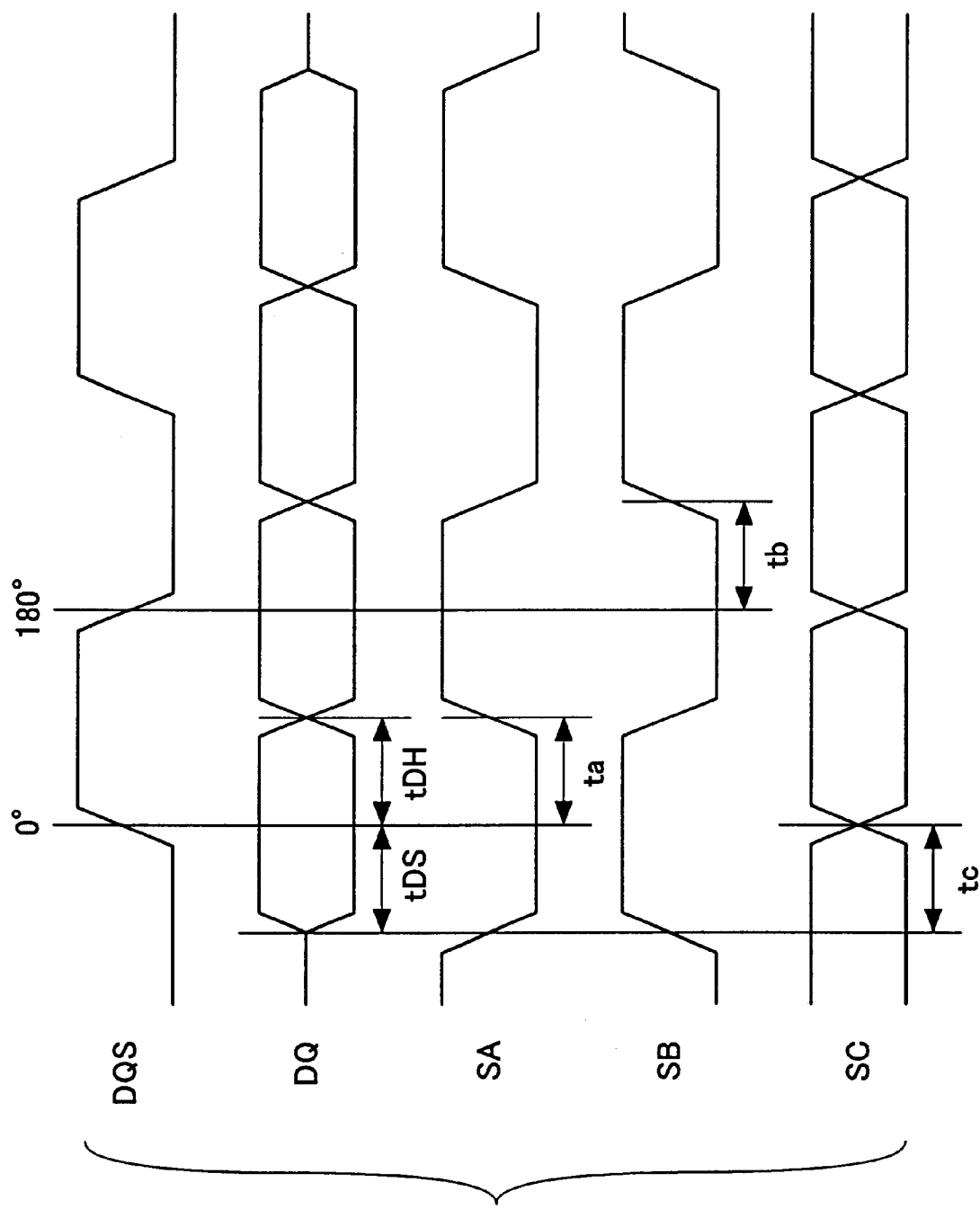
FIG. 2 is a timing chart showing operation of the data-input circuit of FIG. 1.
Figure 3:
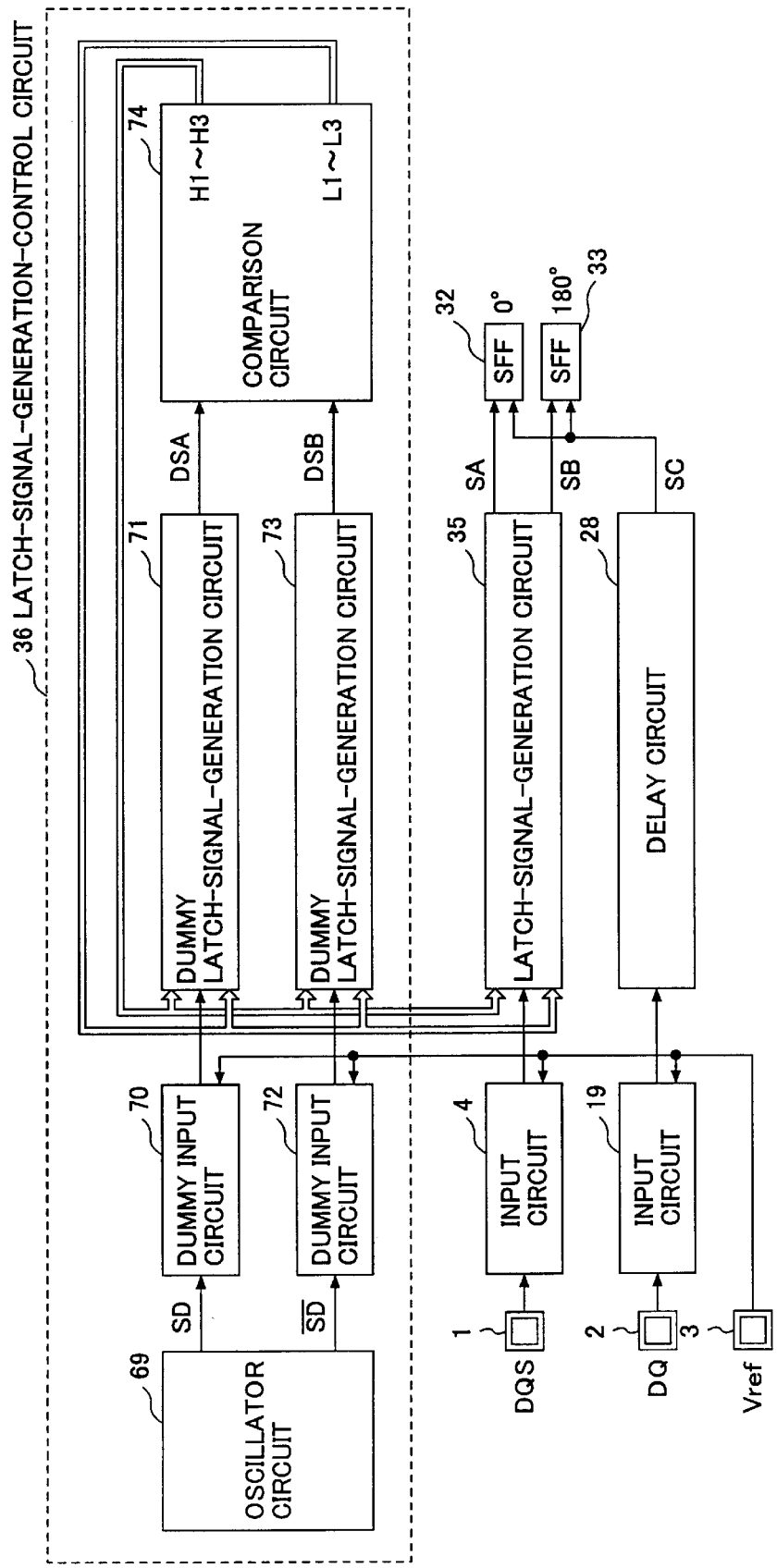
FIG. 3 is a block diagram showing a configuration of a data-input circuit according to a first embodiment of the present invention.

FIG. 3 is a block diagram showing a configuration of a data-input circuit according to a first embodiment of the present invention. In FIG. 3, the same elements as those of FIG. 1 are referred to by the same numerals, and a duplicate description thereof will be omitted.

The data-input circuit of the present invention includes the data-strobe-signal input terminal 1, the data-signal input terminal 2, the reference-voltage input terminal 3, the input circuit 4 and 19, the delay circuit 28, the latch circuit 32 and 33, a latch-signal-generation circuit 35, and a latch-signal-generation-control circuit 36. The latch-signal-generation circuit 35 is provided in place of the latch-signal-generation circuit 13 used in the related-art DDR-SDRAM shown in FIG. 1. Further, the latch-signal-generation-control circuit 36 is provided for the purpose of controlling the latch-signal-generation circuit 35. Except these, the circuit of FIG. 3 has the same configuration as the circuit used in the related-art DDR-SDRAM shown in FIG. 1.

In the first embodiment, the input circuit 4, the latch-signal-generation circuit 35, and the latch-signal-generation-control circuit 36 operate together to attend to automatic control of delay times ta and tb such that a difference between the delay times ta and tb is adjusted to zero or substantially zero within a tolerance range. Here, the delay time ta is a delay from a rising edge (0 edge) of the data-strobe signal DQS to a corresponding rising edge of the latch signal SA, and the delay time tb is a delay from a falling edge (180 edge) of the data-strobe signal DQS to a corresponding rising edge of the latch signal SB. Based on such automatic control, the latch-signal-generation circuit 35 generates the latch signals SA and SB from the data-strobe signal DQS.

Figure 4:
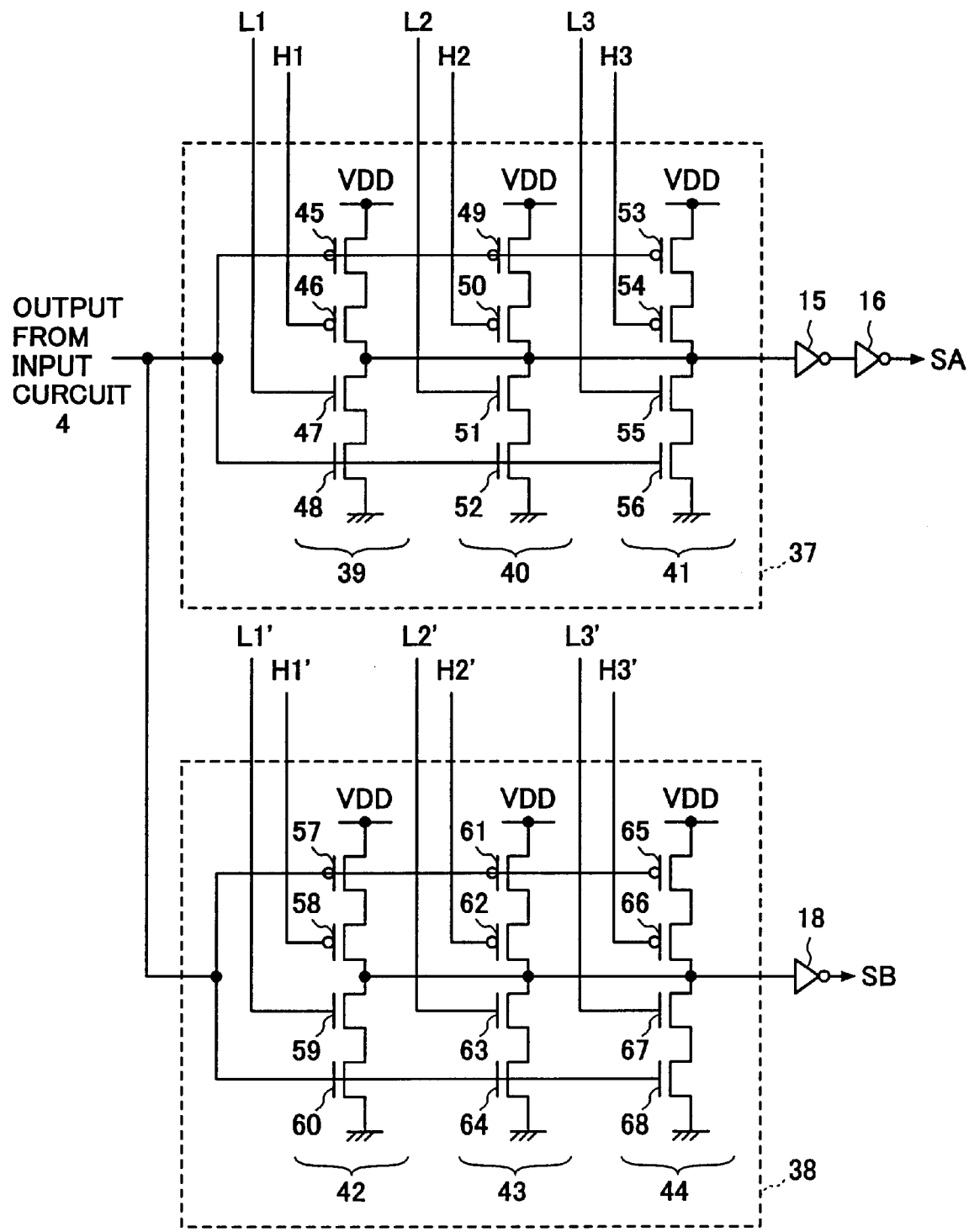
FIG. 4 is a circuit diagram of a latch-signal-generation circuit shown in FIG. 3.

FIG. 4 is a circuit diagram of the latch-signal-generation circuit 35 shown in FIG. 3. The latch-signal-generation circuit 35 includes inverters 37 and 38 in place of the respective inverters 14 and 17 provided in the latch-signal-generation circuit 13 shown in FIG. 1. Except these, the configuration of the latch-signal-generation circuit 35 is the same as the latch-signal-generation circuit 13 shown in FIG. 1.

The inverter 37 includes inverters 39 through 41 connected in parallel, and controls output timings of rising edges of the latch signal SA. This control is achieved by edge-output-timing control signals H1 through H3 supplied from the latch-signal-generation-control circuit 36.

The inverter 39 includes PMOS transistors 45 and 46 and NMOS transistors 47 and 48 connected in series between the VDD power-supply line and the ground line. The PMOS transistor 45 has its on/off status being controlled by the output signal of the input circuit 4. The PMOS transistor 46 has its on/off status controlled by the edge-output-timing control signal H1, and the NMOS transistor 47 has an on/off status thereof being controlled by an edge-output-timing control signal L1 supplied from the latch-signal-generation-control circuit 36. Finally, the NMOS transistor 48 has an on/off status thereof controlled by the output signal of the input circuit 4.

The inverter 40 includes PMOS transistors 49 and 50 and NMOS transistors 51 and 52 connected in series between the VDD power-supply line and the ground line. The PMOS transistor 49 has its on/off status being controlled by the output signal of the input circuit 4. The PMOS transistor 50 has its on/off status controlled by the edge-output-timing control signal H2, and the NMOS transistor 51 has an on/off status thereof being controlled by an edge-output-timing control signal L2. Finally, the NMOS transistor 52 has an on/off status thereof controlled by the output signal of the input circuit 4.

The inverter 41 includes PMOS transistors 53 and 54 and NMOS transistors 55 and 56 connected in series between the VDD power-supply line and the ground line. The PMOS transistor 53 has its on/off status being controlled by the output signal of the input circuit 4. The PMOS transistor 54 has its on/off status controlled by the edge-output-timing control signal H3, and the NMOS transistor 55 has an on/off status thereof being controlled by an edge-output-timing control signal L3. Finally, the NMOS transistor 56 has an on/off status thereof controlled by the output signal of the input circuit 4.

The inverter 38 includes inverters 42 through 44 connected in parallel, and controls output timings of rising edges of the latch signal SB. This control is achieved by edge-output-timing control signals L1' through L3' supplied from the latch-signal-generation-control circuit 36.

The inverter 42 includes PMOS transistors 57 and 58 and NMOS transistors 59 and 60 connected in series between the VDD power-supply line and the ground line. The PMOS transistor 57 has its on/off status being controlled by the output signal of the input circuit 4. The PMOS transistor 58 has its on/off status controlled by an edge-output-timing control signal H1', and the NMOS transistor 59 has an on/off status thereof being controlled by the edge-output-timing control signal L1'. Finally, the NMOS transistor 60 has an on/off status thereof controlled by the output signal of the input circuit 4.

The inverter 43 includes PMOS transistors 61 and 62 and NMOS transistors 63 and 64 connected in series between the VDD power-supply line and the ground line. The PMOS transistor 61 has its on/off status being controlled by the output signal of the input circuit 4. The PMOS transistor 62 has its on/off status controlled by the edge-output-timing control signal H2', and the NMOS transistor 63 has an on/off status thereof being controlled by the edge-output-timing control signal L2'. Finally, the NMOS transistor 64 has an on/off status thereof controlled by the output signal of the input circuit 4.

The inverter 44 includes PMOS transistors 65 and 66 and NMOS transistors 67 and 68 connected in series between the VDD power-supply line and the ground line. The PMOS transistor 65 has its on/off status being controlled by the output signal of the input circuit 4. The PMOS transistor 66 has its on/off status controlled by the edge-output-timing control signal H3', and the NMOS transistor 67 has an on/off status thereof being controlled by the edge-output-timing control signal L3'. Finally, the NMOS transistor 68 has an on/off status thereof controlled by the output signal of the input circuit 4.

In the latch-signal-generation circuit 35 configured as described above, when the edge-output-timing control signals H1, H2, and H3 are all low, the PMOS transistors 46, 50, and 54 are all turned on. The pull-up power of the inverter 37 is most enhanced in this case, so that the rising edges of the latch signal SA have output timings thereof that are most advanced.

When the edge-output-timing control signals H1, H2, and H3 are low, high, and high, respectively, for example, the PMOS transistors 46, 50, and 54 are turned on, off, and off, respectively. The pull-up power of the inverter 37 is the weakest in this case, so that the rising edges of the latch signal SA have output timings thereof that are most delayed.

When the edge-output-timing control signals H1, H2, and H3 are low, low, and high, respectively, for example, the PMOS transistors 46, 50, and 54 are turned on, on, and off, respectively. The pull-up power of the inverter 37 is intermediate in this case, so that the rising edges of the latch signal SA have output timings thereof that are positioned halfway between the most advanced timings and the most delayed timings.

When the edge-output-timing control signals L1', L2', and L3' are all high, the NMOS transistors 59, 63, and 67 are all turned on. The pull-down power of the inverter 38 is most enhanced in this case, so that the rising edges of the latch signal SB have output timings thereof that are most advanced.

When the edge-output-timing control signals L1', L2', and L3' are high, low, and low, respectively, for example, the NMOS transistors 59, 63, and 67 are turned on, off, and off, respectively. The pull-down power of the inverter 38 is the weakest in this case, so that the rising edges of the latch signal SB have output timings thereof that are most delayed.

When the edge-output-timing control signals L1', L2', and L3' are high, high, and low, respectively, for example, the NMOS transistors 59, 63, and 67 are turned on, on, and off, respectively. The pull-down power of the inverter 38 is intermediate in this case, so that the rising edges of the latch signal SB have output timings thereof that are positioned halfway between the most advanced timings and the most delayed timings.

With reference to FIG. 3 again, the latch-signal-generation-control circuit 36 includes an oscillator circuit 69, a dummy input circuit 70, a dummy latch-signal-generation circuit 71, a dummy input circuit 72, a dummy latch-signal-generation circuit 73, and a comparison circuit 74.

The oscillator circuit 69 outputs a dummy data-strobe signal SD for emulating propagation of rising edges of the data-strobe signal DQS, and, also, outputs a dummy data-strobe signal /SD having an inverted phase relative to the dummy data-strobe signal SD for emulating propagation of falling edges of the data-strobe signal DQS. Namely, the oscillator circuit 69 serves as a dummy-data-strobe-signal generation circuit.

The dummy input circuit 70 has the same configuration as the input circuit 4, and receives the dummy data-strobe signal SD. The dummy latch-signal-generation circuit 71 has the same configuration as the latch-signal-generation circuit 35, and generates a dummy latch signal DSA emulating the latch signal SA by controllably inverting and delaying the output signal of the dummy input circuit 70.

The dummy input circuit 72 has the same configuration as the input circuit 4, and receives the dummy data-strobe signal /SD. The dummy latch-signal-generation circuit 73 has the same configuration as the latch-signal-generation circuit 35, and generates a dummy latch signal DSB emulating the latch signal SB by controllably inverting and delaying the output signal of the dummy input circuit 72.

The comparison circuit 74 compares the rising-edge timings of the dummy latch signal DSA with the falling-edge timings of the dummy latch signal DSB. Based on this comparison, the comparison circuit 74 controls the delays of the dummy latch-signal-generation circuits 71 and 73 and the delay of the latch-signal-generation circuit 35, such that the rising-edge timings are concurrent or substantially concurrent between the dummy latch signal DSA and the dummy latch signal DSB.

Figure 5:
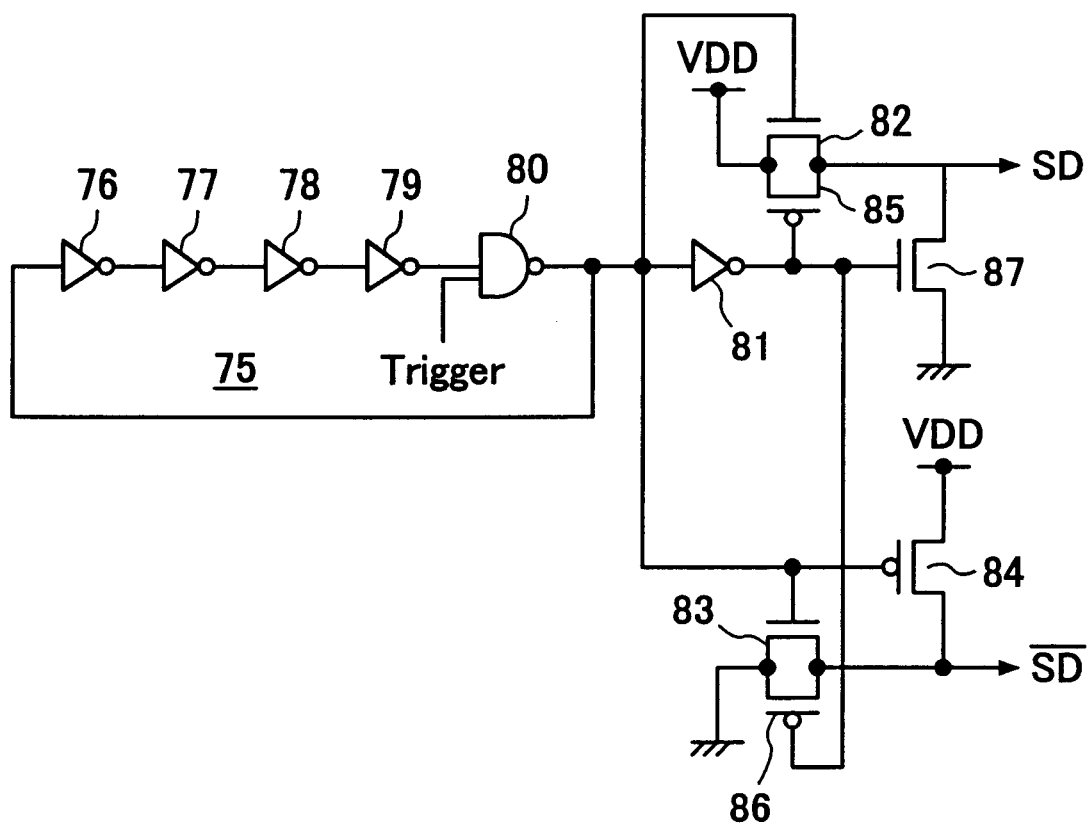
FIG. 5 is a circuit diagram showing a configuration of an oscillator circuit.

FIG. 5 is a circuit diagram showing a configuration of the oscillator circuit 69. In FIG. 3, the oscillator circuit 69 includes a ring oscillator 75 and an inverter 81 for inverting the output of the ring oscillator 75. The ring oscillator 75 includes inverters 76 through 79 and a NAND circuit 80 connected in a loop. When a signal Trigger input to the NAND circuit 80 becomes high, the ring oscillator starts oscillating. The signal Trigger is activated when the adjustment of latch timings according to the present invention is required.

The oscillator circuit 69 further includes NMOS transistors 82 and 83 having an on/off status thereof controlled by the output of the ring oscillator 75, and includes a PMOS transistor 84 having an on/off status thereof also controlled by the output of the ring oscillator 75.

The oscillator circuit 69 further includes NMOS transistors 85 and 86 having an on/off status thereof controlled by the output of the inverter 81, and includes an NMOS transistor 87 having an on/off status thereof also controlled by the output of the inverter 81.

In the oscillator circuit 69 configured as described above, when the output of the ring oscillator 75 is high, the NMOS transistors 82 and 83 are tuned on, and the PMOS transistor 84 is turned off. Further, the output of the inverter 81 is low, so that the PMOS transistors 85 and 86 are turned on, and the NMOS transistor 87 is in a non-conductive state. As a result, the dummy data-strobe signal SD is set to a high level, and the dummy data-strobe signal /SD is set to a low level.

On the other hand, when the output of the ring oscillator 75 is low, the NMOS transistors 82 and 83 are tuned off, and the PMOS transistor 84 is turned on. Further, the output of the inverter 81 is high, so that the PMOS transistors 85 and 86 are turned off, and the NMOS transistor 87 is in a conductive state. As a result, the dummy data-strobe signal SD is set to a low level, and the dummy data-strobe signal /SD is set to a high level.

Figure 6:
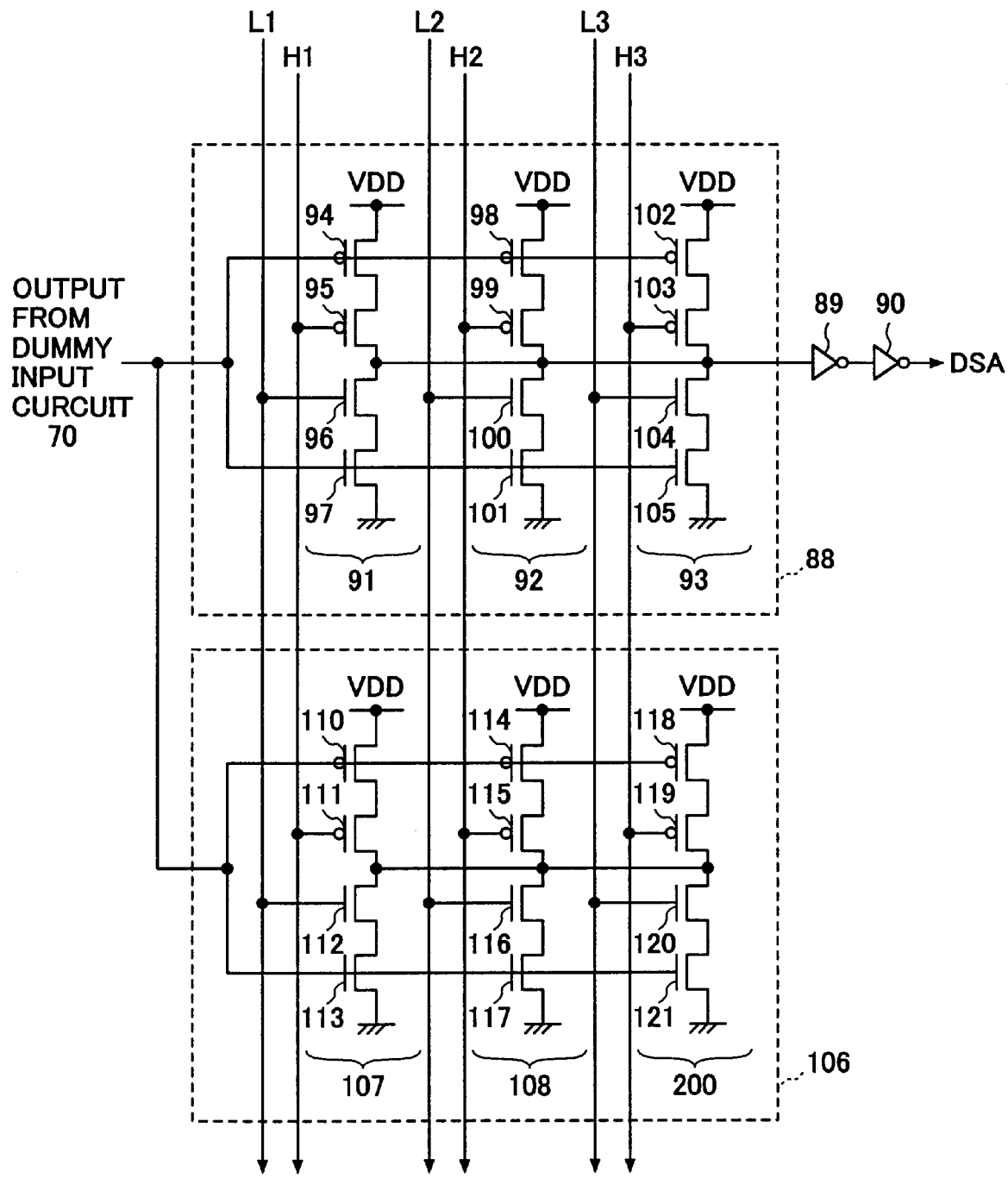
FIG. 6 is a circuit diagram showing a configuration of a dummy latch-signal-generation circuit.

FIG. 6 is a circuit diagram showing a configuration of the dummy latch-signal-generation circuit 71. The dummy latch-signal-generation circuit 71 of FIG. 6 includes inverters 88, 89, and 90 for inverting and delaying the output signal of the dummy input circuit 70 to generate the dummy latch signal DSA. The inverter 88 includes inverters 91 through 93 connected in parallel.

The inverter 91 includes PMOS transistors 94 and 95 and NMOS transistors 96 and 97 connected in series between the VDD power-supply line and the ground line. The PMOS transistor 94 has its on/off status being controlled by the output signal of the dummy input circuit 70. The PMOS transistor 95 has its on/off status controlled by the edge-output-timing control signal H1, and the NMOS transistor 96 has an on/off status thereof being controlled by the edge-output-timing control signal L1. Finally, the NMOS transistor 97 has an on/off status thereof controlled by the output signal of the dummy input circuit 70.

The inverter 92 includes PMOS transistors 98 and 99 and NMOS transistors 100 and 101 connected in series between the VDD power-supply line and the ground line. The PMOS transistor 98 has its on/off status being controlled by the output signal of the dummy input circuit 70. The PMOS transistor 99 has its on/off status controlled by the edge-output-timing control signal H2, and the NMOS transistor 100 has an on/off status thereof being controlled by the edge-output-timing control signal L2. Finally, the NMOS transistor 101 has an on/off status thereof controlled by the output signal of the dummy input circuit 70.

The inverter 93 includes PMOS transistors 102 and 103 and NMOS transistors 104 and 105 connected in series between the VDD power-supply line and the ground line. The PMOS transistor 102 has its on/off status being controlled by the output signal of the dummy input circuit 70. The PMOS transistor 103 has its on/off status controlled by the edge-output-timing control signal H3, and the NMOS transistor 104 has an on/off status thereof being controlled by the edge-output-timing control signal L3. Finally, the NMOS transistor 105 has an on/off status thereof controlled by the output signal of the dummy input circuit 70.

An inverter 106 is provided for the purpose of making the load on the dummy input circuit 70 equal to the load on the input circuit 4, and includes inverters 107 through 109 connected in parallel.

The inverter 107 includes PMOS transistors 110 and 111 and NMOS transistors 112 and 113 connected in series between the VDD power-supply line and the ground line. The PMOS transistor 110 has its on/off status being controlled by the output signal of the dummy input circuit 70. The PMOS transistor 111 has its on/off status controlled by the edge-output-timing control signal H1, and the NMOS transistor 112 has an on/off status thereof being controlled by the edge-output-timing control signal L1. Finally, the NMOS transistor 113 has an on/off status thereof controlled by the output signal of the dummy input circuit 70.

The inverter 108 includes PMOS transistors 114 and 115 and NMOS transistors 116 and 117 connected in series between the VDD power-supply line and the ground line. The PMOS transistor 114 has its on/off status being controlled by the output signal of the dummy input circuit 70. The PMOS transistor 115 has its on/off status controlled by the edge-output-timing control signal H2, and the NMOS transistor 116 has an on/off status thereof being controlled by the edge-output-timing control signal L2. Finally, the NMOS transistor 117 has an on/off status thereof controlled by the output signal of the dummy input circuit 70.

The inverter 109 includes PMOS transistors 118 and 119 and NMOS transistors 120 and 121 connected in series between the VDD power-supply line and the ground line. The PMOS transistor 118 has its on/off status being controlled by the output signal of the dummy input circuit 70. The PMOS transistor 119 has its on/off status controlled by the edge-output-timing control signal H3, and the NMOS transistor 120 has an on/off status thereof being controlled by the edge-output-timing control signal L3. Finally, the NMOS transistor 121 has an on/off status thereof controlled by the output signal of the dummy input circuit 70.

In the dummy latch-signal-generation circuit 71 configured as described above, when the edge-output-timing control signals H1, H2, and H3 are all low, the PMOS transistors 95, 99, and 103 are all turned on. The pull-up power of the inverter 88 is most enhanced in this case, so that the rising edges of the dummy latch signal DSA have output timings thereof that are most advanced.

When the edge-output-timing control signals H1, H2, and H3 are low, high, and high, respectively, for example, the PMOS transistors 95, 99, and 103 are turned on, off, and off, respectively. The pull-up power of the inverter 88 is the weakest in this case, so that the rising edges of the dummy latch signal DSA have output timings thereof that are most delayed.

When the edge-output-timing control signals H1, H2, and H3 are low, low, and high, respectively, for example, the PMOS transistors 95, 99, and 103 are turned on, on, and off, respectively. The pull-up power of the inverter 88 is intermediate in this case, so that the rising edges of the dummy latch signal DSA have output timings thereof that are positioned halfway between the most advanced timings and the most delayed timings.

Figure 7:
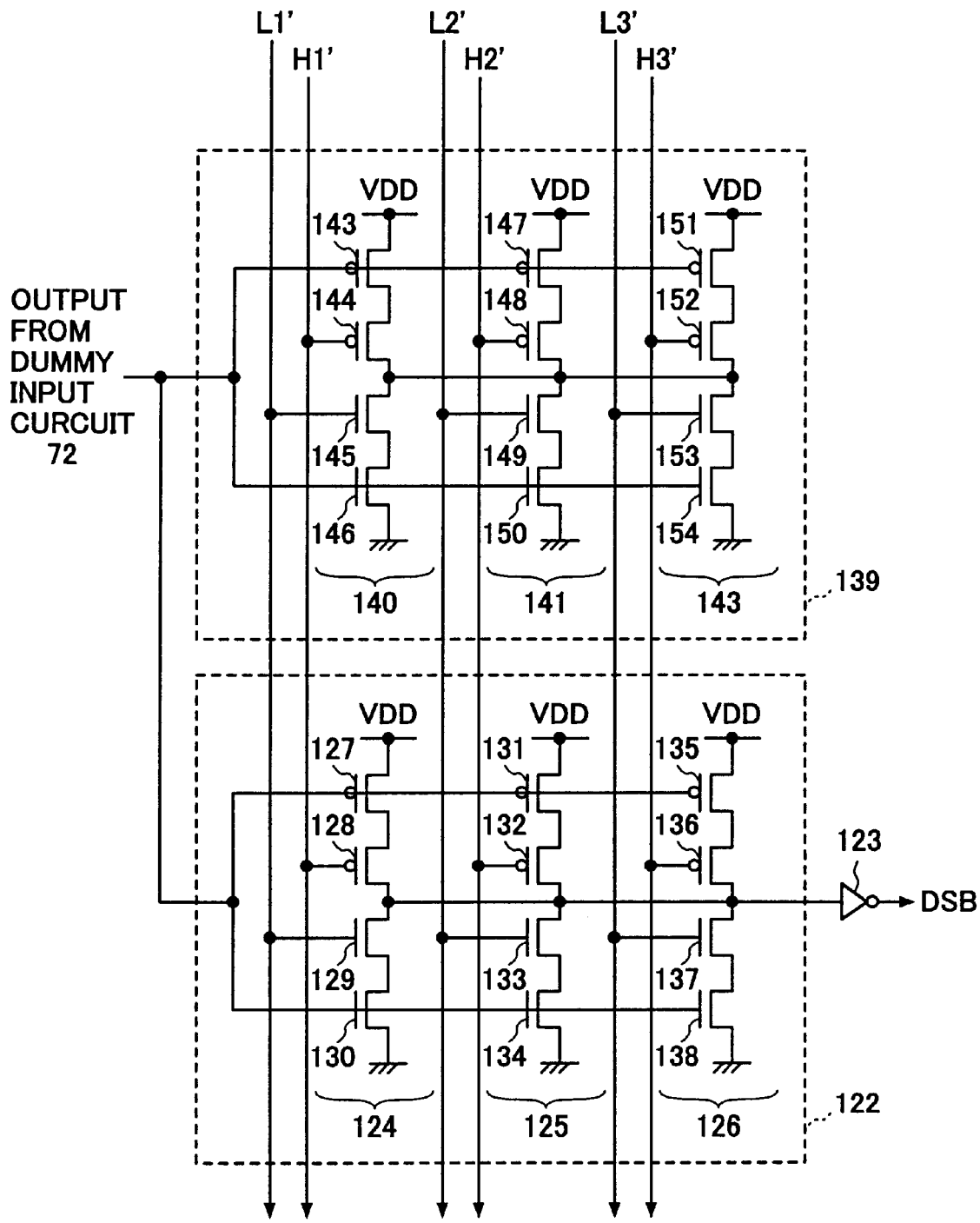
FIG. 7 is a circuit diagram showing a configuration of a dummy latch-signal-generation circuit.

FIG. 7 is a circuit diagram showing a configuration of the dummy latch-signal-generation circuit 73. The dummy latch-signal-generation circuit 73 of FIG. 7 includes inverters 122 and 123 for delaying the output signal of the dummy input circuit 72 to generate the dummy latch signal DSB. The inverter 122 includes inverters 124 through 126 connected in parallel.

The inverter 124 includes PMOS transistors 127 and 128 and NMOS transistors 129 and 130 connected in series between the VDD power-supply line and the ground line. The PMOS transistor 127 has its on/off status being controlled by the output signal of the dummy input circuit 72. The PMOS transistor 128 has its on/off status controlled by the edge-output-timing control signal H1', and the NMOS transistor 129 has an on/off status thereof being controlled by the edge-output-timing control signal L1'. Finally, the NMOS transistor 130 has an on/off status thereof controlled by the output signal of the dummy input circuit 72.

The inverter 125 includes PMOS transistors 131 and 132 and NMOS transistors 133 and 134 connected in series between the VDD power-supply line and the ground line. The PMOS transistor 131 has its on/off status being controlled by the output signal of the dummy input circuit 72. The PMOS transistor 132 has its on/off status controlled by the edge-output-timing control signal H2', and the NMOS transistor 133 has an on/off status thereof being controlled by the edge-output-timing control signal L2'. Finally, the NMOS transistor 134 has an on/off status thereof controlled by the output signal of the dummy input circuit 72.

The inverter 126 includes PMOS transistors 135 and 136 and NMOS transistors 137 and 138 connected in series between the VDD power-supply line and the ground line. The PMOS transistor 135 has its on/off status being controlled by the output signal of the dummy input circuit 72. The PMOS transistor 136 has its on/off status controlled by the edge-output-timing control signal H3', and the NMOS transistor 137 has an on/off status thereof being controlled by the edge-output-timing control signal L3'. Finally, the NMOS transistor 138 has an on/off status thereof controlled by the output signal of the dummy input circuit 72.

An inverter 139 is provided for the purpose of making the load on the dummy input circuit 72 equal to the load on the input circuit 4, and includes inverters 140 through 142 connected in parallel.

The inverter 140 includes PMOS transistors 143 and 144 and NMOS transistors 145 and 146 connected in series between the VDD power-supply line and the ground line. The PMOS transistor 143 has its on/off status being controlled by the output signal of the dummy input circuit 72. The PMOS transistor 144 has its on/off status controlled by the edge-output-timing control signal H1', and the NMOS transistor 145 has an on/off status thereof being controlled by the edge-output-timing control signal L1'. Finally, the NMOS transistor 146 has an on/off status thereof controlled by the output signal of the dummy input circuit 72.

The inverter 141 includes PMOS transistors 147 and 148 and NMOS transistors 149 and 150 connected in series between the VDD power-supply line and the ground line. The PMOS transistor 147 has its on/off status being controlled by the output signal of the dummy input circuit 72. The PMOS transistor 148 has its on/off status controlled by the edge-output-timing control signal H2', and the NMOS transistor 149 has an on/off status thereof being controlled by the edge-output-timing control signal L2'. Finally, the NMOS transistor 150 has an on/off status thereof controlled by the output signal of the dummy input circuit 72.

The inverter 142 includes PMOS transistors 151 and 152 and NMOS transistors 153 and 154 connected in series between the VDD power-supply line and the ground line. The PMOS transistor 151 has its on/off status being controlled by the output signal of the dummy input circuit 72. The PMOS transistor 152 has its on/off status controlled by the edge-output-timing control signal H3', and the NMOS transistor 153 has an on/off status thereof being controlled by the edge-output-timing control signal L3'. Finally, the NMOS transistor 154 has an on/off status thereof controlled by the output signal of the dummy input circuit 72.

In the dummy latch-signal-generation circuit 73 configured as described above, when the edge-output-timing control signals L1', L2', and L3' are all high, the NMOS transistors 129, 133, and 137 are all turned on. The pull-down power of the inverter 122 is most enhanced in this case, so that the rising edges of the dummy latch signal DSB have output timings thereof that are most advanced.

When the edge-output-timing control signals L1', L2', and L3' are high, low, and low, respectively, for example, the NMOS transistors 129, 133, and 137 are turned on, off, and off, respectively. The pull-down power of the inverter 122 is the weakest in this case, so that the rising edges of the dummy latch signal DSB have output timings thereof that are most delayed.

When the edge-output-timing control signals L1', L2', and L3' are high, high, and low, respectively, for example, the NMOS transistors 129, 133, and 137 are turned on, on, and off, respectively. The pull-down power of the inverter 122 is intermediate in this case, so that the rising edges of the dummy latch signal DSB have output timings thereof that are positioned halfway between the most advanced timings and the most delayed timings.

Figure 8:
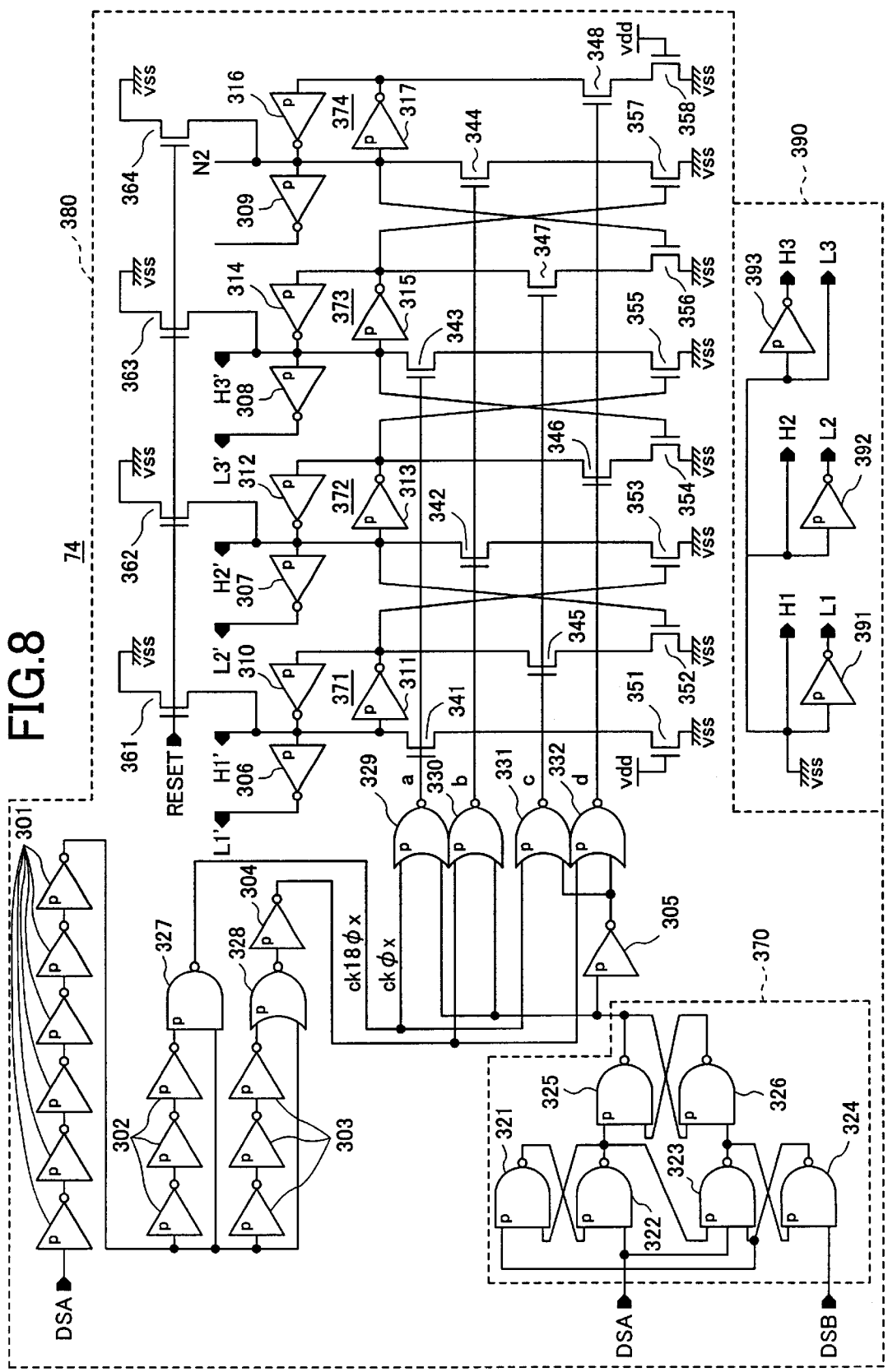
FIG. 8 is a circuit diagram of a comparison circuit.

FIG. 8 is a circuit diagram of the comparison circuit 74.

The comparison circuit 74 of FIG. 8 includes a variable-signal part 380 and a fixed-signal part 390. The variable-signal part 380 outputs the edge-output-timing control signals H' through H3' and L1' through L3', and the fixed-signal part 390 outputs the edge-output-timing control signals H1 through H3 and L1 through L3.

The variable-signal part 380 of the comparison circuit 74 includes a plurality of inverters 301 connected in series, a plurality of inverters 302 connected in series, a plurality of inverters 303 connected in series, inverters 305 through 317, NAND circuits 321 through 327, NOR circuits 328 through 332, NMOS transistors 341 through 348, NMOS transistors 351 through 358, and NMOS transistors 361 through 364.

The NAND circuits 321 through 326 together form a phase comparison circuit 370, which receives the dummy latch signal DSA and the dummy latch signal DSB from the dummy latch-signal-generation circuit 71 and the dummy latch-signal-generation circuit 73, respectively. The phase comparison circuits 73 compares edge timings between the dummy latch signal DSA and the dummy latch signal DSB, and outputs a high-level signal at a node N thereof when the dummy latch signal DSB is ahead of the dummy latch signal DSA in terms of edge timings thereof. When the dummy latch signal DSA is ahead of the dummy latch signal DSB in terms of edge timings thereof, on the other hand, the phase comparison circuit 73 outputs a low-level signal at the node N.

Further, the dummy latch signal DSA has a waveform thereof reshaped by the NAND circuit 327, and a resulting clock signal is supplied to the NOR circuits 329 and 331. The dummy latch signal DSA is also reshaped by the NOR circuit 328 and the inverter 304, and a resulting clock signal that is staggered relative to the above-noted clock signal is supplied to the NOR circuits 330 and 332.

When the dummy latch signal DSA is ahead of the dummy latch signal DSB, the voltage at the node N is low, so that the NOR circuits 329 and 330 supply clock pulses to signal lines a and b in turn while signal lines c and d are fixed to a low level. When the dummy latch signal DSB is ahead of the dummy latch signal DSA, the voltage at the node N is high, so that the NOR circuits 331 and 332 supply clock pulses to signal lines c and d in turn while signal lines a and b are fixed to a low level.

At an initial stage, a reset signal RESET is set to high, so that latches 371 through 373 each comprised of a pair of inverters latch low-level signals as the edge-output-timing control signals H1' through H3'.

When the dummy latch signal DSB is ahead of the dummy latch signal DSA, clock pulses are supplied to the signal lines c and d in turn. When the signal line d becomes high, the NMOS transistor 348 becomes conductive, so that the status of the latch 374 is reversed to output a high-level signal at a node N2. This makes the NMOS transistor 356 conductive. When the signal line c becomes high in turn, the NMOS transistor 347 becomes conductive, so that the status of the latch 373 is reversed to output a high-level signal as the edge-output-timing control signal H3'.

As the clock pulses continue to be supplied to signal lines c and d in turn, the edge-output-timing control signal H2' becomes high in addition to the edge-output-timing control signal H3', and, then, the edge-output-timing control signal H1' becomes high in addition to the edge-output-timing control signals H2' and H3'.

In this manner, when the dummy latch signal DSB is ahead of the dummy latch signal DSA, the edge-output-timing control signals H1' through H3' are successively changed from low to high. Namely, the edge-output-timing control signals L1' through L3' are successively changed from high to low. This results in the rising edges of the dummy latch signal DSB being successively delayed because of successive decreases of the pull-down power of inverters provided in the dummy latch-signal-generation circuit 73 as shown in FIG. 7. At the same time, the rising edges of the latch signal SB are successively delayed as can be seen from FIG. 4.

When the dummy latch signal DSA is ahead of the dummy latch signal DSB, the clock pulses are successively supplied to the signal lines a and b in turn in FIG. 8, so that the edge-output-timing control signals H1' through H3' are successively changed from high to low. Namely, the edge-output-timing control signals L1' through L3' are successively changed from low to high. This results in the rising edges of the dummy latch signal DSB being successively advanced because of successive increases of the pull-down power of inverters provided in the dummy latch-signal-generation circuit 73 as shown in FIG. 7. At the same time, the rising edges of the latch signal SB are successively advanced as can be seen from FIG. 4.

Such adjustment as described above is performed by setting the edge-output-timing control signals H1 through H3 and L1 through L3 to respective fixed signal levels in advance.

In FIG. 8, the fixed-signal part 390 of the comparison circuit 74 includes inverters 391 through 393, and outputs the edge-output-timing control signals H1 through H3 and L1 through L3 fixed to respective signal levels. This setting of signals fixes the timings of the latch signal SA and the dummy latch signal DSA. Then, timings of the latch signal SB and the dummy latch signal DSB are adjusted as described above, such that the dummy latch signal DSB is aligned with the dummy latch signal DSA. It should be noted that the timing of the dummy latch signal DSA may be adjusted instead of the dummy latch signal DSB by setting the dummy latch signal DSB to a fixed timing.

In the first embodiment as described above, the comparison circuit 74 adjusts the delays of the dummy latch-signal-generation circuits 71 and 73 and the delay of the latch-signal-generation circuit 35, such that the rising-edge timings are the same or substantially the same between the dummy latch signal DSA and the dummy latch signal DSB.

Namely, the total delay time of the dummy input circuit 70 and the dummy latch-signal-generation circuit 71 combined is adjusted to control the timings of rising edges of the dummy data-strobe signal SD, and the total delay time of the dummy input circuit 72 and the dummy latch-signal-generation circuit 73 combined is adjusted to control the timings of rising edges of the dummy data-strobe signal /SD. Through this adjustment, the total delay times are made equal or substantially equal by the comparison circuit 74.

A set of circuitry that a rising edge of the dummy data-strobe signal SD passes through before turning into a rising edge of the dummy latch signal DSA is configured to have the same structure as a set of circuitry that a rising edge of the data-strobe signal DQS passes through before turning into a rising edge of the latch signal SA.

Because of such a configuration, the delay time from a rising edge of the dummy data-strobe signal SD to a corresponding rising edge of the dummy latch signal DSA is identical or substantially identical to the delay time from a rising edge of the data-strobe signal DQS to a corresponding rising edge of the latch signal SA.

Further, a set of circuitry that a falling edge of the dummy data-strobe signal /SD passes through before turning into a rising edge of the dummy latch signal DSB is configured to have the same structure as a set of circuitry that a falling edge of the data-strobe signal DQS passes through before turning into a rising edge of the latch signal SB.

Because of such a configuration, the delay time from a falling edge of the dummy data-strobe signal /SD to a corresponding rising edge of the dummy latch signal DSB is identical or substantially identical to the delay time from a falling edge of the data-strobe signal DQS to a corresponding rising edge of the latch signal SB.

Accordingly, as the comparison circuit 74 adjusts the delays of the dummy latch-signal-generation circuits 71 and 73 and the delay of the of the latch-signal-generation circuit 35 such that the total delay time of the dummy input circuit 70 and the dummy latch-signal-generation circuit 71 with respect to the rising edges of the dummy data-strobe signal SD is adjusted equal to or substantially equal to the total delay time of the dummy input circuit 72 and the dummy latch-signal-generation circuit 73 with respect to the falling edges of the dummy data-strobe signal /SD, the delay time from a rising edge of the data-strobe signal DQS to a corresponding rising edge of the latch signal SA becomes equal to or substantially equal to the delay time from a falling edge of the data strobe signal DQS to a corresponding rising edge of the latch signal SB.

According to the first embodiment of the present invention, therefore, margins of the setup time tDS and the hold time tDH that are defined with respect to the input data signal DQ are improved, thereby helping efforts toward faster operation speed.

Figure 9:
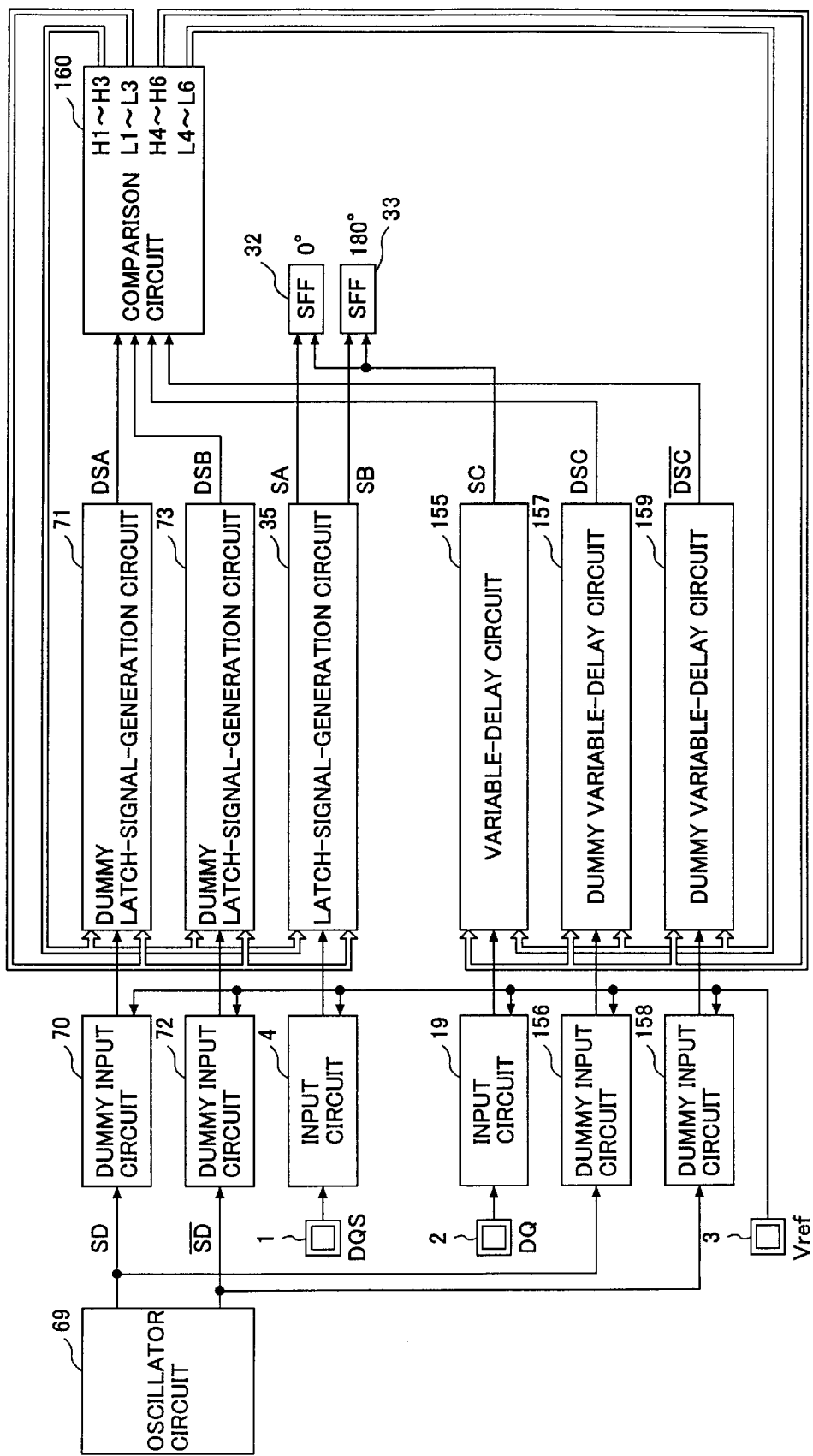
FIG. 9 is a block diagram showing a configuration of a data-input circuit according to a second embodiment of the present invention.

FIG. 9 is a block diagram showing a configuration of a data-input circuit according to a second embodiment of the present invention. In FIG. 9, the same elements as those of FIG. 3 are referred to by the same numerals, and a duplicate description thereof will be omitted.

In the second embodiment of the present invention, a variable-delay circuit 155 for controlling a delay time is provided in place of the delay circuit 28 shown in FIG. 3.

Further, a dummy input circuit 156 having the same configuration as the input circuit 19 is provided to receive the dummy data-strobe signal SD. A dummy variable-delay circuit 157 having the same configuration as the variable-delay circuit 155 is also provided, and receives the output signal of the dummy input circuit 156.

The dummy input circuit 156 and the dummy variable-delay circuit 157 generate a dummy latch-target signal DSC by using the dummy data-strobe signal SD as a dummy input data signal. This is done for the purpose of emulating delays of rising edges of the input data signal DQ.

Further, a dummy input circuit 158 having the same configuration as the input circuit 19 is provided to receive the dummy data-strobe signal /SD. A dummy variable-delay circuit 159 having the same configuration as the variable-delay circuit 155 is also provided, and receives the output signal of the dummy input circuit 158.

The dummy input circuit 158 and the dummy variable-delay circuit 159 generate a dummy latch-target signal /DSC by using the dummy data-strobe signal /SD as a dummy input data signal. This is done for the purpose of emulating delays of falling edges of the input data signal DQ.

Moreover, a comparison circuit 160 having an additional function supplemented to the functions of the comparison circuit 74 is provided in place of the comparison circuit 74 shown in FIG. 3. Except these, the configuration of the second embodiment is the same as that of the first embodiment.

The comparison circuit 160 has an extra function in addition to the functions of the comparison circuit 74 shown in FIG. 3, and controls the delays of the dummy variable-delay circuits 157 and 159 and the delay of the variable-delay circuit 155 such that rising-edge timings are the same or substantially the same between the dummy latch signal DSA and the dummy latch-target signal DSC, and the rising-edge timings of the dummy latch-target signal DSC are the same or substantially the same as the falling-edge timings of the dummy latch-target signal /DSC.

Figure 10:
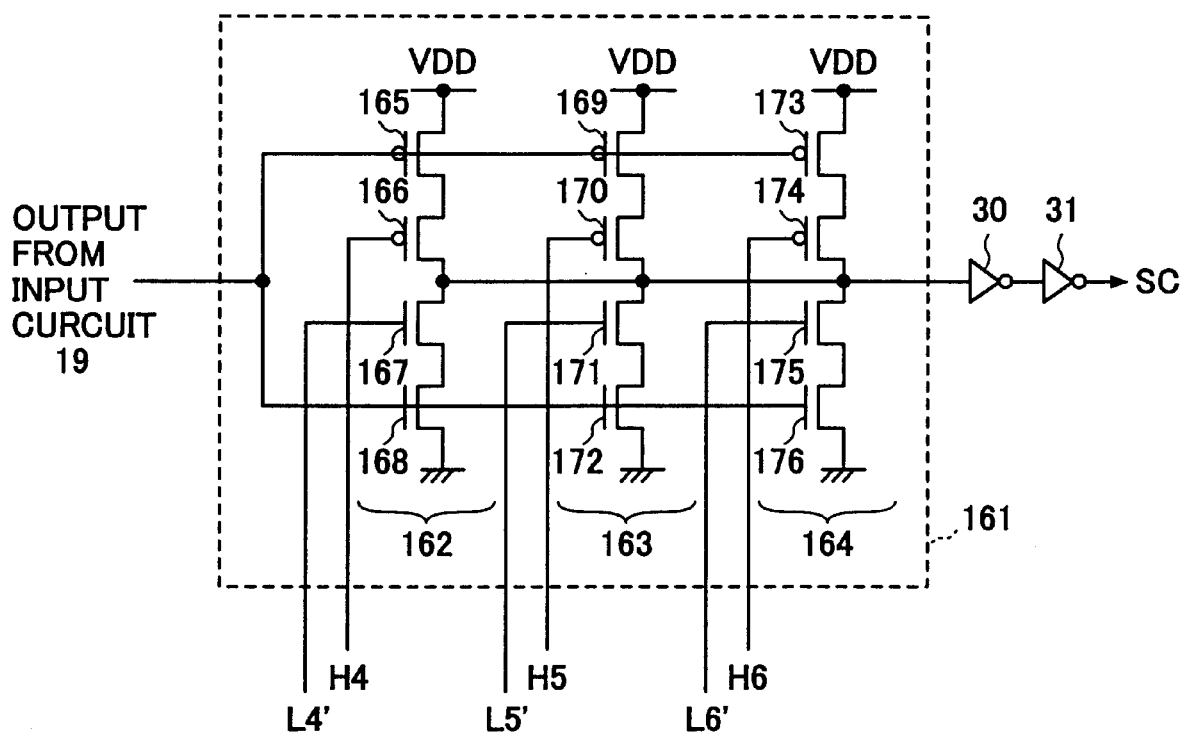
FIG. 10 is a circuit diagram showing a configuration of a variable-delay circuit.

FIG. 10 is a circuit diagram showing a configuration of the variable-delay circuit 155. The variable-delay circuit 155 of FIG. 10 is provided with an inverter 161 in place of the inverter 29 provided for the delay circuit 28 shown in FIG. 1 and FIG. 3. Except this, the variable-delay circuit 155 has the same configuration as the delay circuit 28 shown in FIG. 1 and FIG. 3.

The inverter 161 includes inverters 162 through 164 connected in parallel, and controls output timings of rising edges of the latch-target signal SC. This control is achieved by edge-output-timing control signals H4 through H6 supplied from the comparison circuit 160. Further, the inverter 161 controls output timings of falling edges of the latch-target signal SC. This control is achieved by edge-output-timing control signals L4' through L6' supplied from the comparison circuit 160.

The inverter 162 includes PMOS transistors 165 and 166 and NMOS transistors 167 and 168 connected in series between the VDD power-supply line and the ground line. The PMOS transistor 165 has its on/off status being controlled by the output signal of the input circuit 19. The PMOS transistor 166 has its on/off status controlled by the edge-output-timing control signal H4, and the NMOS transistor 167 has an on/off status thereof being controlled by the edge-output-timing control signal L4'. Finally, the NMOS transistor 168 has an on/off status thereof controlled by the output signal of the input circuit 19.

The inverter 163 includes PMOS transistors 169 and 170 and NMOS transistors 171 and 172 connected in series between the VDD power-supply line and the ground line. The PMOS transistor 169 has its on/off status being controlled by the output signal of the input circuit 19. The PMOS transistor 170 has its on/off status controlled by the edge-output-timing control signal H5, and the NMOS transistor 171 has an on/off status thereof being controlled by the edge-output-timing control signal L5'. Finally, the NMOS transistor 172 has an on/off status thereof controlled by the output signal of the input circuit 19.

The inverter 164 includes PMOS transistors 173 and 174 and NMOS transistors 175 and 176 connected in series between the VDD power-supply line and the ground line. The PMOS transistor 173 has its on/off status being controlled by the output signal of the input circuit 19. The PMOS transistor 174 has its on/off status controlled by the edge-output-timing control signal H6, and the NMOS transistor 175 has an on/off status thereof being controlled by the edge-output-timing control signal L6'. Finally, the NMOS transistor 176 has an on/off status thereof controlled by the output signal of the input circuit 19.

In the variable-delay circuit 155 configured as described above, when the edge-output-timing control signals H4, H5, and H6 are all low, the PMOS transistors 166, 170, and 174 are all turned on. The pull-up power of the inverter 161 is most enhanced in this case, so that the rising edges of the latch-target signal SC have output timings thereof that are most advanced.

When the edge-output-timing control signals H4, H5, and H6 are low, high, and high, respectively, for example, the PMOS transistors 166, 170, and 174 are turned on, off, and off, respectively. The pull-up power of the inverter 161 is the weakest in this case, so that the rising edges of the latch-target signal SC have output timings thereof that are most delayed.

When the edge-output-timing control signals H4, H5, and H6 are low, low, and high, respectively, for example, the PMOS transistors 166, 170, and 174 are turned on, on, and off, respectively. The pull-up power of the inverter 161 is intermediate in this case, so that the rising edges of the latch-target signal SC have output timings thereof that are positioned halfway between the most advanced timings and the most delayed timings.

When the edge-output-timing control signals L4', L5', and L6' are all high, the NMOS transistors 167, 171, and 175 are all turned on. The pull-down power of the inverter 161 is most enhanced in this case, so that the falling edges of the latch-target signal SC have output timings thereof that are most advanced.

When the edge-output-timing control signals L4', L5', and L6' are high, low, and low, respectively, for example, the NMOS transistors 167, 171, and 175 are turned on, off, and off, respectively. The pull-down power of the inverter 161 is the weakest in this case, so that the falling edges of the latch-target signal SC have output timings thereof that are most delayed.

When the edge-output-timing control signals L4', L5', and L6' are high, high, and low, respectively, for example, the NMOS transistors 167, 171, and 175 are turned on, on, and off, respectively. The pull-down power of the inverter 161 is intermediate in this case, so that the falling edges of the latch-target signal SC have output timings thereof that are positioned halfway between the most advanced timings and the most delayed timings.

Figure 11:
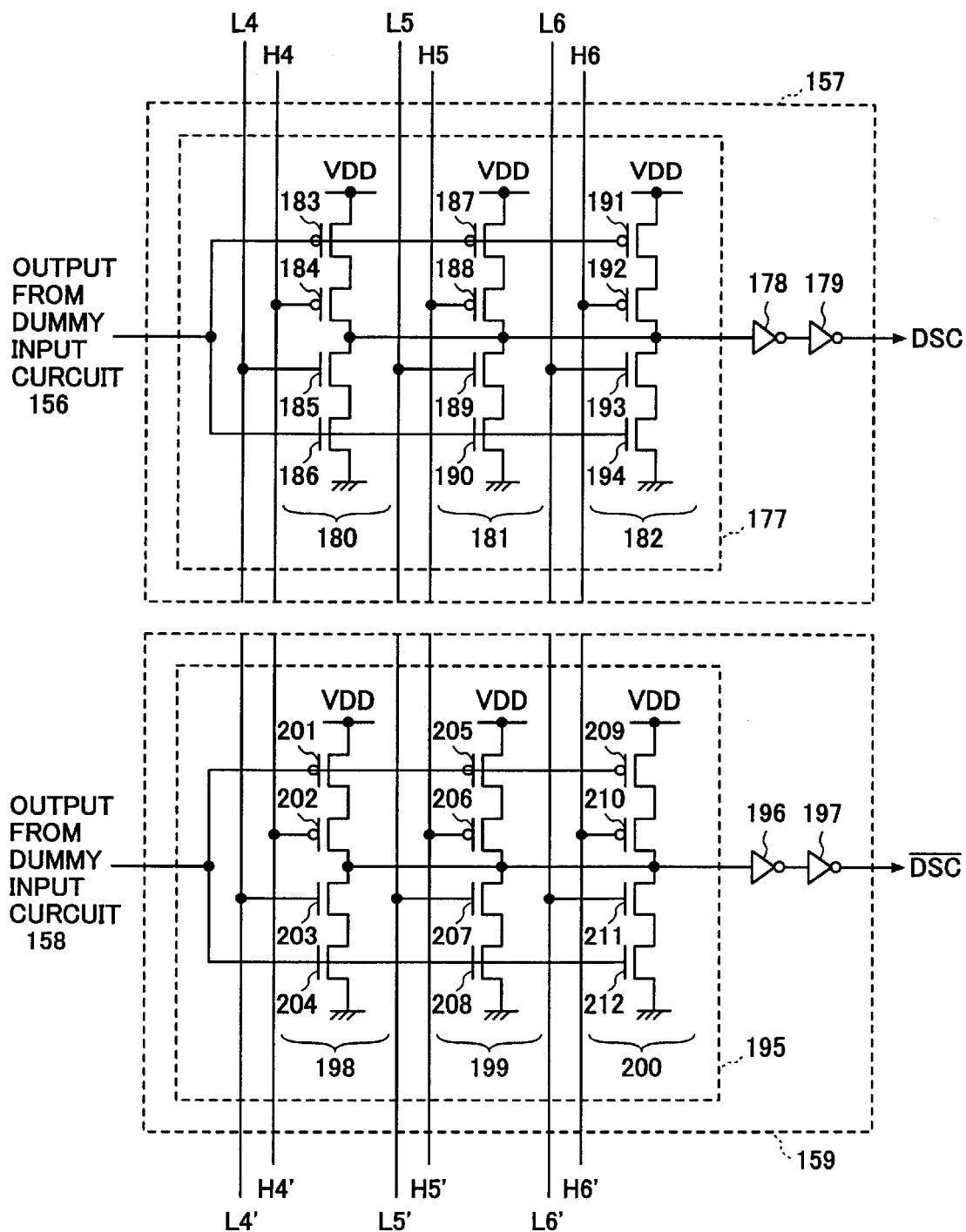
FIG. 11 is a circuit diagram showing a configuration of a dummy variable-delay circuit and a dummy variable-delay circuit.

FIG. 11 is a circuit diagram showing a configuration of the dummy variable-delay circuit 157 and the dummy variable-delay circuit 159. The dummy variable-delay circuit 157 includes inverters 177 through 179, wherein the inverter 177 is comprised of inverters 180 through 182 connected in parallel.

The inverter 180 includes PMOS transistors 183 and 184 and NMOS transistors 185 and 186 connected in series between the VDD power-supply line and the ground line. The PMOS transistor 183 has its on/off status being controlled by the output signal of the dummy input circuit 156. The PMOS transistor 184 has its on/off status controlled by the edge-output-timing control signal H4, and the NMOS transistor 185 has an on/off status thereof being controlled by the edge-output-timing control signal L4. Finally, the NMOS transistor 186 has an on/off status thereof controlled by the output signal of the dummy input circuit 156.

The inverter 181 includes PMOS transistors 187 and 188 and NMOS transistors 189 and 190 connected in series between the VDD power-supply line and the ground line. The PMOS transistor 187 has its on/off status being controlled by the output signal of the dummy input circuit 156. The PMOS transistor 188 has its on/off status controlled by the edge-output-timing control signal H5, and the NMOS transistor 189 has an on/off status thereof being controlled by the edge-output-timing control signal L5. Finally, the NMOS transistor 190 has an on/off status thereof controlled by the output signal of the dummy input circuit 156.

The inverter 182 includes PMOS transistors 191 and 192 and NMOS transistors 193 and 194 connected in series between the VDD power-supply line and the ground line. The PMOS transistor 191 has its on/off status being controlled by the output signal of the dummy input circuit 156. The PMOS transistor 192 has its on/off status controlled by the edge-output-timing control signal H6, and the NMOS transistor 193 has an on/off status thereof being controlled by the edge-output-timing control signal L6. Finally, the NMOS transistor 194 has an on/off status thereof controlled by the output signal of the dummy input circuit 156.

In the dummy variable-delay circuit 157 configured as described above, when the edge-output-timing control signals H4, H5, and H6 are all low, the PMOS transistors 184, 188, and 192 are all turned on. The pull-up power of the inverter 177 is most enhanced in this case, so that the rising edges of the dummy latch-target signal DSC have output timings thereof that are most advanced.

When the edge-output-timing control signals H4, H5, and H6 are low, high, and high, respectively, for example, the PMOS transistors 184, 188, and 192 are turned on, off, and off, respectively. The pull-up power of the inverter 177 is the weakest in this case, so that the rising edges of the dummy latch-target signal DSC have output timings thereof that are most delayed.

When the edge-output-timing control signals H4, H5, and H6 are low, low, and high, respectively, for example, the PMOS transistors 184, 188, and 192 are turned on, on, and off, respectively. The pull-up power of the inverter 177 is intermediate in this case, so that the rising edges of the dummy latch-target signal DSC have output timings thereof that are positioned halfway between the most advanced timings and the most delayed timings.

The dummy variable-delay circuit 159 includes inverters 195 through 197, wherein the inverter 195 is comprised of inverters 198 through 200 connected in parallel.

The inverter 198 includes PMOS transistors 201 and 202 and NMOS transistors 203 and 204 connected in series between the VDD power-supply line and the ground line. The PMOS transistor 201 has its on/off status being controlled by the output signal of the dummy input circuit 158. The PMOS transistor 202 has its on/off status controlled by the edge-output-timing control signal H4', and the NMOS transistor 203 has an on/off status thereof being controlled by the edge-output-timing control signal L4'. Finally, the NMOS transistor 204 has an on/off status thereof controlled by the output signal of the dummy input circuit 158.

The inverter 199 includes PMOS transistors 205 and 206 and NMOS transistors 207 and 208 connected in series between the VDD power-supply line and the ground line. The PMOS transistor 205 has its on/off status being controlled by the output signal of the dummy input circuit 158. The PMOS transistor 206 has its on/off status controlled by the edge-output-timing control signal H5', and the NMOS transistor 207 has an on/off status thereof being controlled by the edge-output-timing control signal L5'. Finally, the NMOS transistor 208 has an on/off status thereof controlled by the output signal of the dummy input circuit 158.

The inverter 200 includes PMOS transistors 209 and 210 and NMOS transistors 211 and 212 connected in series between the VDD power-supply line and the ground line. The PMOS transistor 209 has its on/off status being controlled by the output signal of the dummy input circuit 158. The PMOS transistor 210 has its on/off status controlled by the edge-output-timing control signal H6', and the NMOS transistor 211 has an on/off status thereof being controlled by the edge-output-timing control signal L6'. Finally, the NMOS transistor 212 has an on/off status thereof controlled by the output signal of the dummy input circuit 158.

In the dummy variable-delay circuit 159 configured as described above, when the edge-output-timing control signals L4', L5', and L6' are all high, the NMOS transistors 203, 207, and 211 are all turned on. The pull-down power of the inverter 195 is most enhanced in this case, so that the falling edges of the dummy latch-target signal /DSC have output timings thereof that are most advanced.

When the edge-output-timing control signals L4', L5', and L6' are high, low, and low, respectively, for example, the NMOS transistors 203, 207, and 211 are turned on, off, and off, respectively. The pull-down power of the inverter 195 is the weakest in this case, so that the falling edges of the dummy latch-target signal /DSC have output timings thereof that are most delayed.

When the edge-output-timing control signals L4', L5', and L6' are high, high, and low, respectively, for example, the NMOS transistors 203, 207, and 211 are turned on, on, and off, respectively. The pull-down power of the inverter 195 is intermediate in this case, so that the falling edges of the dummy latch-target signal /DSC have output timings thereof that are positioned halfway between the most advanced timings and the most delayed timings.

Figure 12:
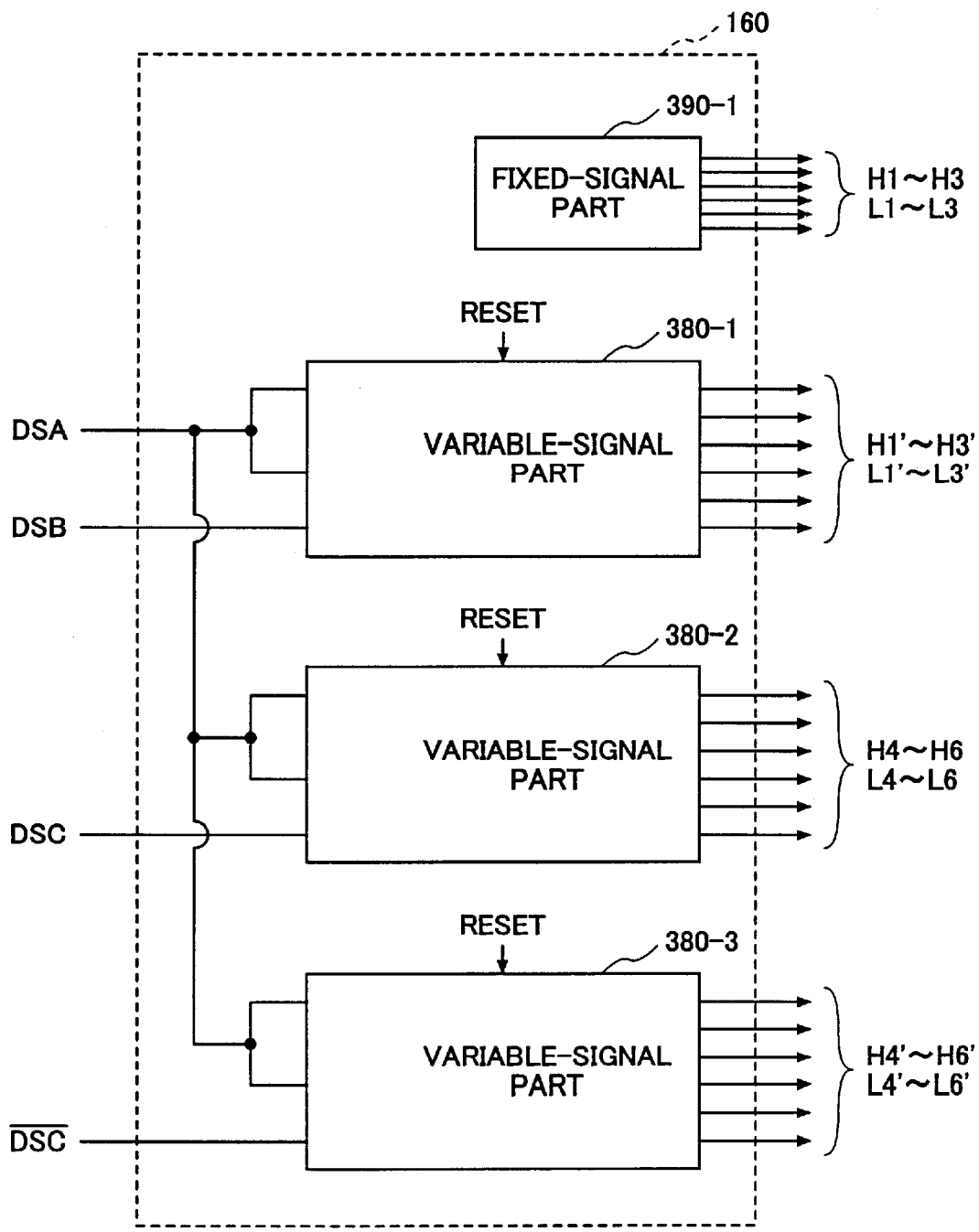
FIG. 12 is a block diagram showing a configuration of a comparison circuit shown in FIG. 9.

FIG. 12 is a block diagram showing a configuration of the comparison circuit 160.

The comparison circuit 160 of FIG. 12 includes variable-signal parts 380-1 through 380-3 that are identical to the variable-signal part 380 of the comparison circuit 74 shown in FIG. 8. The comparison circuit 160 further includes a fixed-signal part 390-1 that is identical to the fixed signal part 390 of the comparison circuit 74 shown in FIG. 8.

The variable-signal part 380-1 compares timings of the dummy latch signals DSA and DSB, and outputs the edge-output-timing control signals H1' through H3' and L1' through L3' for the purpose of aligning the dummy latch signals DSA and DSB. The variable-signal part 380-2 compares timings of the dummy latch signal DSA and the dummy latch-target signal DSC, and outputs the edge-output-timing control signals H4 through H6 and L4 through L6 with an aim of aligning the dummy latch-target signal DSC with the dummy latch signal DSA. The variable-signal part 380-3 compares timings of the dummy latch signal DSA and the dummy latch-target signal /DSC, and outputs the edge-output-timing control signals H4' through H6' and L4' through L6' with an aim of aligning the dummy latch-target signal /DSC with the dummy latch signal DSA.

The fixed-signal part 390-1 outputs the edge-output-timing control signals H1 through H3 and L1 through L3. These signals serve to define the edge timings of the latch signal SA and the dummy latch signal DSA.

According to the second embodiment of the present invention, the comparison circuit 160 controls the delays of the dummy latch-signal-generation circuits 71 and 73, the latch-signal-generation circuit 35, the dummy variable-delay circuit 157, and the variable-delay circuit 155, such that rising-edge timings are the same or substantially the same between the latch signal SA and the latch signal SB as well as between the latch signal SA and the dummy latch-target signal DSC.

Further, the comparison circuit 160 controls the delays of the variable-delay circuit 155 and the dummy variable-delay circuit 159, such that the rising-edge timings of the dummy latch-target signal DSC are the same or substantially the same as the falling-edge timings of the dummy latch-target signal /DSC.

As a result, the delay time from a rising edge of the data-strobe signal DQS to a corresponding rising edge of the latch signal SA is adjusted equal to the delay time from a falling edge of the data-strobe signal DQS to a corresponding rising edge of the latch signal SB. The delay time from a rising edge of the input data signal DQ to a corresponding rising edge of the latch-target signal SC is adjusted equal to the delay time from a rising edge of the data-strobe signal DQS to a corresponding rising edge of the latch signal SA. Further, the delay time from a falling edge of the input data signal DQ to a corresponding falling edge of the latch-target signal SC is adjusted equal to the delay time from a rising edge of the data-strobe signal DQS to a corresponding rising edge of the latch signal SA.

Accordingly, the second embodiment of the present invention can further improve margins of the setup time tDS and the hold time tDH over the first embodiment of the present invention when the setup time tDS and the hold time tDH defined with respect to the input data signal DQ are a 1:1 ratio. This helps efforts toward faster operation speed.

Figure 13:
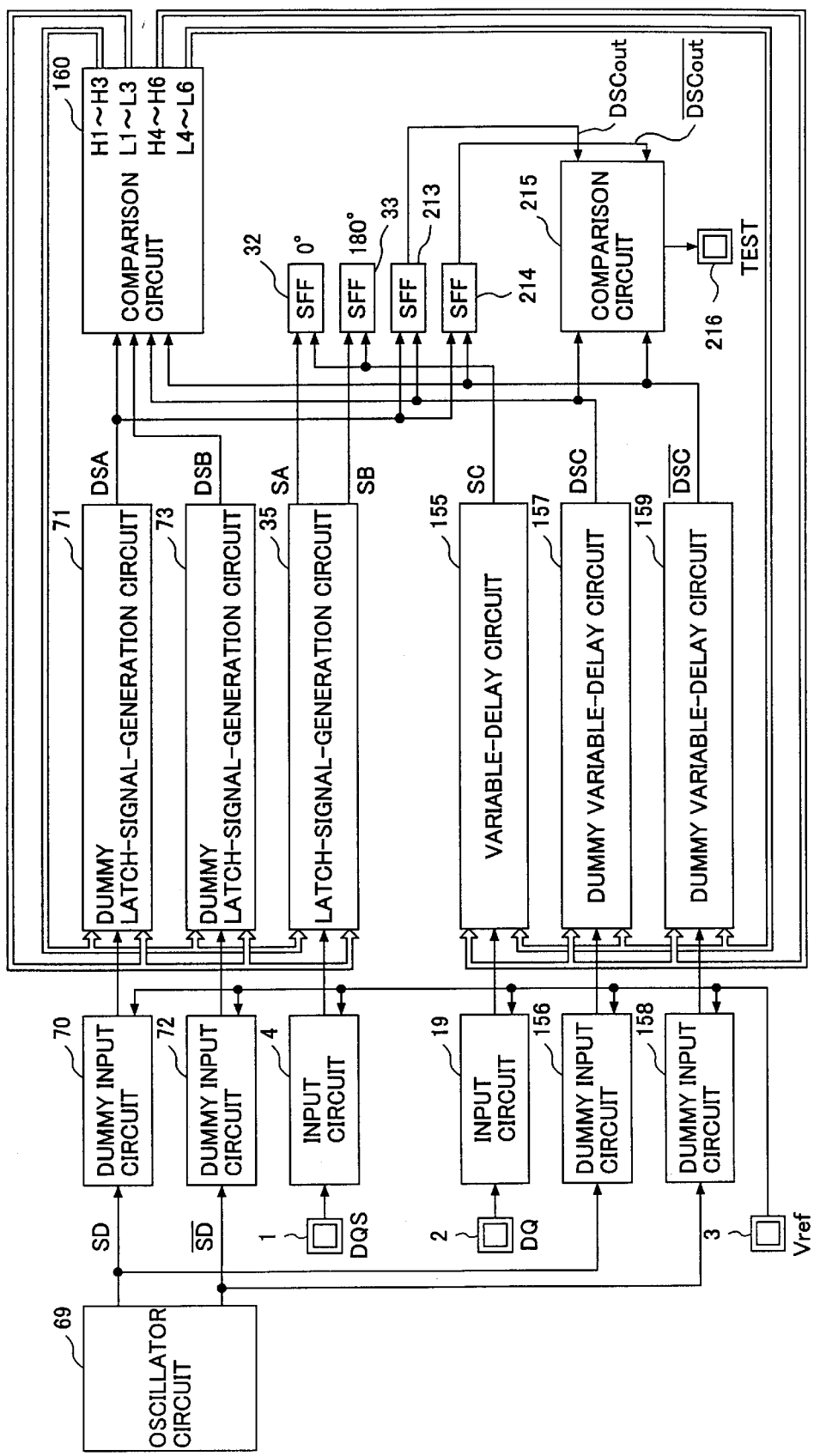
FIG. 13 is a block diagram showing a configuration of a data-input circuit according to a third embodiment of the present invention.

FIG. 13 is a block diagram showing a configuration of a data-input circuit according to a third embodiment of the present invention. In FIG. 13, the same elements as those of FIG. 9 are referred to by the same numerals, and a duplicate description thereof will be omitted.

In the third embodiment of the present invention, dummy latch circuits 213 and 214 are newly provided for the purpose of emulating the latch circuits 32 and 33. Further, a comparison circuit 215 and a test-signal-output terminal 216 are newly provided. Except these new additions, the third embodiment has the same configuration as the second embodiment shown in FIG. 9.

Figure 14:
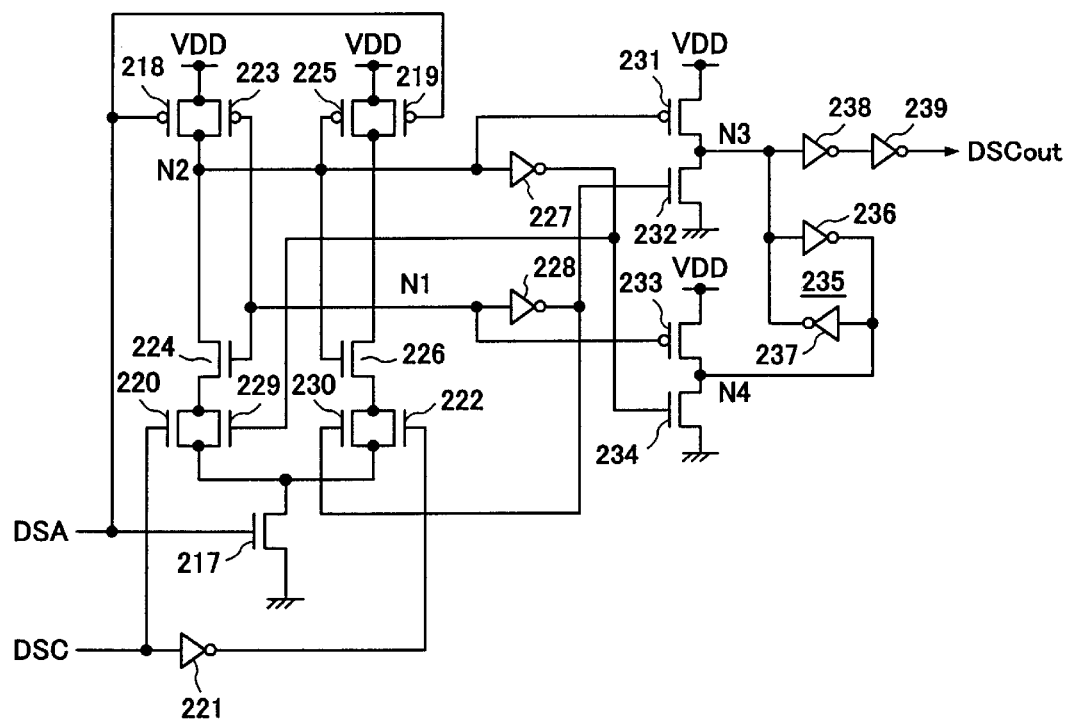
FIG. 14 is a circuit diagram of a dummy latch circuit.

FIG. 14 is a circuit diagram of the dummy latch circuit 213. The dummy latch circuit 214 has the same configuration as shown in this figure. In FIG. 14, the dummy latch circuit 213 includes an NMOS transistor 217 having an on/off status thereof controlled by the dummy latch signal DSA. The dummy latch signal DSA also controls an on/off status of PMOS transistors 218 and 219.

An NMOS transistor 220 has an on/off status thereof controlled by the dummy latch-target signal DSC. An inverter 221 inverts the dummy latch-target signal DSC. The output of the inverter 221 controls an on/off status of an NMOS transistor 222.

A PMOS transistor 223 has an on/off status thereof controlled by a voltage appearing at a node N1, and an NMOS transistor 224 has an on/off status thereof controlled by the voltage of the node N1.

A PMOS transistor 225 has an on/off status thereof controlled by a voltage appearing at a node N2, and an NMOS transistor 226 has an on/off status thereof controlled by the voltage of the node N2.

An inverter 227 inverts the voltage of the node N2, and an inverter 228 inverts the voltage of the node N1. The output of the inverter 227 controls an on/off status of an NMOS transistor 229, and the output of the inverter 228 controls an on/off status of an NMOS transistor 230.

The voltage of the node N2 controls an on/off status of a PMOS transistor 231, and the output of the inverter 228 controls an on/off status of an NMOS transistor 232.

The voltage of the node N1 controls a conductive/non-conductive status of a PMOS transistor 233, and the output of the inverter 227 controls a conductive/non-conductive status of an NMOS transistor 234.

A latch circuit 235 includes inverters 236 and 237, and holds a voltage appearing at a node N4. An inverter 238 inverts a voltage appearing at a node N3. An inverter 239 inverts the output of an inverter 238, and supplies the inverted signal as an output signal DSCout of the dummy latch circuit 213.

The dummy latch circuit 214 has the same configuration, and operates in the same manner as the dummy latch circuit 213. The dummy latch circuit 214 receives the dummy latch signal DSA and the dummy latch-target signal /DSC, and outputs a signal /DSCout.

The comparison circuit 215 receives the dummy latch-target signals DSC and /DSC as well as the signals DSCout and /DSCout. The comparison circuit 215 then detects whether the dummy latch-target signal DSC is properly latched by the dummy latch signal DSA, and also detects whether the dummy latch-target signal /DSC is properly latched by the dummy latch signal DSA. The comparison circuit 215 then supplies results of the comparison to the test-signal-output terminal 216 as a test signal TEST.

Such a check by the comparison circuit 215 is easily made. All that is necessary is to check if the dummy latch-target signal DSC is the same as the signal DSCout.

Figure 15:
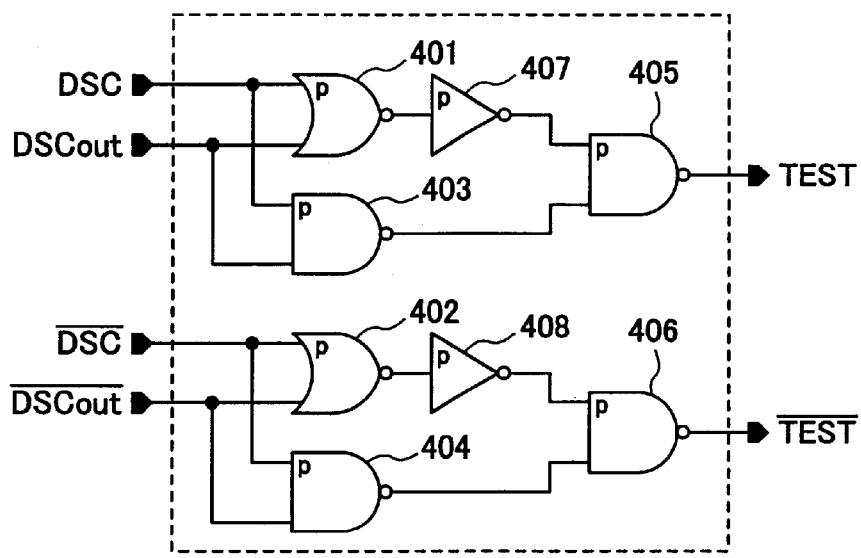
FIG. 15 is a circuit diagram of a comparison circuit shown in FIG. 13.

FIG. 15 is a circuit diagram of the comparison circuit 215.

The comparison circuit 215 of FIG. 13 includes NOR circuits 401 and 402, NAND circuits 403 through 406, and inverters 407 and 408.

If the dummy latch-target signal DSC is the same as the signal DSCout, the test signal TEST becomes high. A check of the logical level of the test signal TEST makes it possible to ascertain whether the dummy latch-target signal DSC is properly latched by the dummy latch signal DSA. This reveals whether the latch circuits 32 and 33 are operating within acceptable margins.

Further, the third embodiment of the present invention may be so configured as to make the output timings of rising edges of the dummy latch signal DSA controllable from the exterior of the device.

Figure 16:
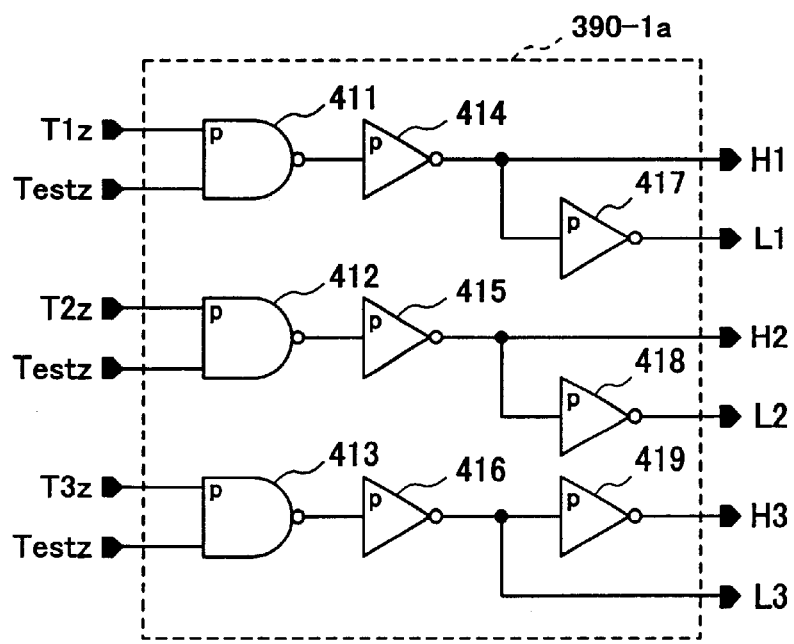
FIG. 16 is a circuit diagram showing a variation of a fixed-signal part of the comparison circuit shown in FIG. 12.

FIG. 16 is a circuit diagram showing a variation of the fixed-signal part 390-1 of the comparison circuit 160.

A fixed-signal part 390-1a of FIG. 16 includes NAND circuits 411 through 413 and inverters 414 through 419. A test-mode signal Testz indicates a test mode when it is at a high level. Setting signals T1z through T3z are provided from outside the device, and serve to set the edge-output-timing control signals H1 through H3 and L1 through L3 to respective fixed levels during the test mode. This allows the edge timings of the dummy latch signal DSA to be set from the exterior of the device.

Figure 17:
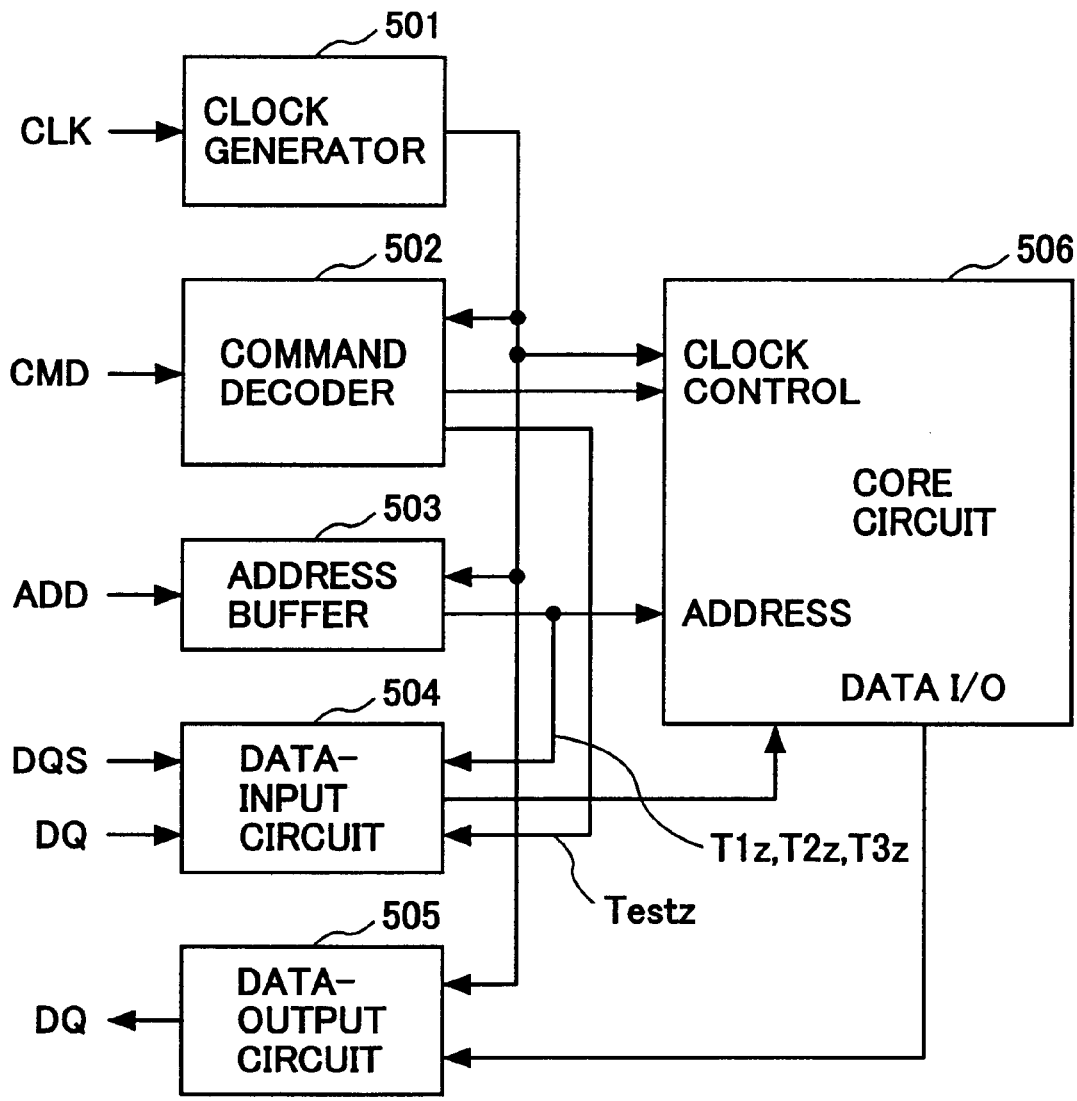
FIG. 17 is a block diagram of an example of a semiconductor device to which the data-input circuit of the present invention is applied.

FIG. 17 is a block diagram of an example of a semiconductor device in which the dummy latch signal DSA is controllable from outside the device.

The semiconductor device of FIG. 17 is a semiconductor memory device, for example, and includes a clock generator 501, a command decoder 502, an address buffer 503, a data-input circuit 504, a data-output circuit 505, and a core circuit 506. The clock generator 501 receives a clock signal CLK from the exterior of device, and generates internal clock signals, which are distributed to various internal circuits within the device. The command decoder 502 receives command signals CMD, and controls operation of the device in accordance with the received command signals CMD. The address buffer 503 receives address signals ADD, and supplies the received addresses to the core circuit 506.

The data-input circuit 504 is the data input circuit of the present invention such as shown in FIG. 13. The data-output circuit 505 is for outputting data from the core circuit 506 to the exterior of the device. The core circuit 506 includes memory cell arrays, word decoders, column decoders, sense amplifiers, etc.

When the command signals CMD indicates a test mode, the test-mode signal Testz is supplied from the command decoder 502 to the data-input circuit 504, in which the fixed-signal part 390-1a of the comparison circuit 160 receives the test-mode signal Testz. Further, the address signals ADD are supplied to the address buffer 503 to define the setting signals T1z through T3z during the test mode, and the setting signals T1z through T3z are sent to the data-input circuit 504 where the fixed-signal part 390-1a of the comparison circuit 160 receives these signals.

In the manner as described above, the third embodiment of the present invention makes it possible to set the edge timings of the dummy latch signal DSA from the exterior of the device.

The third embodiment of the present invention as described above produces the same results and the same advantages as the second embodiment, and allows the latch circuits 32 and 33 to be tested with regard to their characteristics by changing the output timings of rising edges of the dummy latch signal DSA.

Further, the adjustment of the latch-signal-generation circuit 35 according to the first embodiment and the adjustment of the latch-signal-generation circuit 35 and the variable-delay circuit 155 according to the second and third embodiments may be carried out at the time of power on of the device. In this case, the adjustment operation is preferably completed before the startup sequences of the device come to an end.

Further, the adjustment of the latch-signal-generation circuit 35 according to the first embodiment and the adjustment of the latch-signal-generation circuit 35 and the variable-delay circuit 155 according to the second and third embodiments may be initiated by a command that is supplied to the device to indicate a time period during which the data-input characteristics are to be optimized. In FIG. 17, for example, such a command may be entered in the command decoder 502, which in turn informs the data-input circuit 504 that the adjustment of edge timings need to be performed.

Moreover, the adjustment of the latch-signal-generation circuit 35 according to the first embodiment and the adjustment of the latch-signal-generation circuit 35 and the variable-delay circuit 155 according to the second and third embodiments may be started upon arrival of a command that requests operations involving use of the data-input circuit. In FIG. 17, for example, such a command may be entered in the command decoder 502, which in turn informs the data-input circuit 504 that the adjustment of edge timings need to be performed.

Alternatively, the adjustment of the latch-signal-generation circuit 35 according to the first embodiment and the adjustment of the latch-signal-generation circuit 35 and the variable-delay circuit 155 according to the second and third embodiments may be performed at all times.

The first embodiment of the present invention has been described with reference to a case in which the latch signals SA and SB are controlled in term of their rising edge timings by the variable-delay circuits. Alternatively, current-mirror-type amplifier circuits that constitute the input circuits may be used for the purpose of controlling the rising edge timings of the latch signals SA and SB.

By the same token, the current-mirror-type amplifier circuits that constitute the input circuits may be used for the purpose of controlling the rising edge timings of the latch signals SA and SB and the rising and falling edge timings of the latch-target signal SC in the second and third embodiments of the present invention.

As described above, the present invention attends to automatic control, such that the a delay time from a rising edge of a data strobe signal to a corresponding edge of a first latch signal is adjusted substantially equal to a delay time from a falling edge of the data strobe signal to a corresponding edge of a second latch signal, with the adjustment achieving errors within a tolerance range. Under the adjusted conditions, the first and second latch signals are generated form the data strobe signal. This improves margins of the setup time and the hold time that are defined with respect to a data signal, thereby helping efforts toward faster operation speed.

Further, the present invention is not limited to these embodiments, but various variations and modifications may be made without departing from the scope of the present invention.

The present application is based on Japanese priority application No. 11-310673 filed on Nov. 1, 1999, with the Japanese Patent Office, the entire contents of which are hereby incorporated by reference.

What is claimed is:

1. A semiconductor circuit which receives a strobe signal and a data signal, comprising:

a latch-signal-generation circuit which generates a first latch signal delayed by a first delay time relative to the strobe signal and a second latch signal inverted and delayed by a second delay time relative to the strobe signal;

a control circuit which adaptively controls said latch-signal-generation circuit to adjust timings of the first and second latch signals such that the first delay time and the second delay time become substantially equal; and a latch circuit which latches the data signal at edge timings of the first and second latch signals.

2. The semiconductor circuit as claimed in claim 1, wherein said control circuit includes:

a first dummy-latch-signal-control circuit which generates a first dummy latch signal delayed by a first dummy delay time relative to a reference timing;

a second dummy-latch-signal-control circuit which generates a second dummy latch signal delayed by a second dummy delay time relative to the reference timing; and a comparison circuit which compares edge timings between the first dummy latch signal and the second dummy latch signal, and controls said first and second dummy-latch-signal-control circuits to adjust the first and second dummy delay times such that the first and second dummy latch signals have substantially concurrent edge timings, said comparison circuit controlling said latch-signal-generation circuit such that the first delay time is adjusted equal to the first dummy delay time, and the second delay time is adjusted equal to the second dummy delay time.

3. The semiconductor circuit as claimed in claim 2, further comprising an input circuit which receives the strobe signal from outside said semiconductor circuit, and supplies the strobe signal to the latch-signal-generation circuit, wherein said control circuit further includes:

an oscillator circuit which generates at least one dummy strobe signal; and a dummy input circuit which receives the at least one dummy strobe signal, and outputs at least one reference signal that defines said reference timing.

4. The semiconductor circuit as claimed in claim 1, further comprising a variable-delay circuit which delays the data signal by a third delay time before the data signal is supplied to said latch circuit, wherein said control circuit further controls said variable-delay circuit to adjust the third delay time such that the third delay time is adjusted substantially equal to the first delay time or to the second delay time.

5. The semiconductor circuit as claimed in claim 2, further comprising a variable-delay circuit which delays the data signal by a third delay time before the data signal is supplied to said latch circuit, wherein said control circuit further includes a dummy variable-delay circuit which generates a dummy data signal delayed by a third dummy delay time relative to the reference timing, said comparison circuit comparing edge timings between the dummy data signal and one of the first and second dummy latch signals, and controls said dummy variable-delay circuit to adjust the third dummy delay time such that the dummy data signal has edge timings substantially concurrent with edge timings of the one of the first and second dummy latch signals, said comparison circuit controlling said variable-dummy circuit such that the third delay time is adjusted equal to the third dummy delay time.

6. The semiconductor circuit as claimed in claim 1, wherein said latch-signal-generation circuit includes:

a plurality of first inverters connected in parallel to receive the strobe signal and output the first latch signal, said first inverters being selectively driven to adjust the first delay time; and a plurality of second inverters connected in parallel to receive the strobe signal and output the second latch signal, said second inverters being selectively driven to adjust the second delay time.

7. The semiconductor circuit as claimed in claim 1, wherein the adjustment of the timings of the first and second latch signals is completed before startup sequences of said semiconductor circuit come to an end.

8. The semiconductor circuit as claimed in claim 1, wherein the adjustment of the timings of the first and second latch signals is started upon arrival of a command that indicates a necessity for optimization of data-input characteristics.

9. The semiconductor circuit as claimed in claim 1, wherein the adjustment of the timings of the first and second latch signals is started upon arrival of a command that requests operation involving use of said latch circuit.

10. A semiconductor circuit, which receives a strobe signal and a data signal, comprising:

a latch-signal-generation circuit which generates a first latch signal delayed relative to the strobe signal by a first delay time measured from a first-type edge of the strobe signal to a corresponding edge of the first latch signal, and generates a second latch signal inverted and delayed relative to the strobe signal by a second delay time measured from a second-type edge of the strobe signal to a corresponding edge of the second latch signal, the first-type edge being one of a rising edge and a falling edge and the second-type edge being another one of the rising edge and the falling edge;

a latch circuit which latches the data signal at edge timings of the first and second latch signals; and a control circuit which adaptively controls said latch-signal-generation circuit to adjust timings of the first and second latch signals such that the first delay time and the second delay time become substantially equal.

11. The semiconductor circuit as claimed in claim 10, wherein said control circuit includes:

a first dummy-latch-signal-control circuit which generates a first dummy latch signal delayed relative to a reference signal by a first dummy delay time measured from the first-type edge of the reference signal to a corresponding edge of the first dummy latch signal;

a second dummy-latch-signal-control circuit which generates a second dummy latch signal inverted and delayed relative to an inverse of the reference signal by a second dummy delay time measured from the second-type edge of the inverse of the reference signal to a corresponding edge of the second dummy latch signal; and a comparison circuit which compares edge timings between the first dummy latch signal and the second dummy latch signal, and controls said first and second dummy-latch-signal-control circuits to adjust the first and second dummy delay times such that the first and second dummy latch signals have substantially concurrent edge timings, said comparison circuit controlling said latch-signal-generation circuit such that the first delay time is adjusted equal to the first dummy delay time, and the second delay time is adjusted equal to the second dummy delay time.

* * * * *